United States Patent
Ng et al.

(10) Patent No.: US 11,476,806 B2
(45) Date of Patent: Oct. 18, 2022

(54) JUMP-START POWER AMPLIFIER BOOST CONVERTER

(71) Applicant: Skyworks Solutions, Inc., Irvine, CA (US)

(72) Inventors: Wendy Ng, Los Gatos, CA (US); James Jason LoCascio, Mountain View, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 2 days.

(21) Appl. No.: 17/060,872

(22) Filed: Oct. 1, 2020

(65) Prior Publication Data

US 2021/0104979 A1 Apr. 8, 2021

Related U.S. Application Data

(60) Provisional application No. 62/910,314, filed on Oct. 3, 2019, provisional application No. 62/910,310, filed on Oct. 3, 2019.

(51) Int. Cl.
*H03F 1/30* (2006.01)
*H03F 3/20* (2006.01)
(Continued)

(52) U.S. Cl.
CPC ............ *H03F 1/305* (2013.01); *H02M 1/143* (2013.01); *H02M 3/157* (2013.01); *H02M 3/158* (2013.01);
(Continued)

(58) Field of Classification Search
CPC ... H03F 1/305; H03F 3/20; H03F 3/24; H03F 2200/451; H03F 2200/102; H03F 1/0227;
(Continued)

(56) References Cited

U.S. PATENT DOCUMENTS 7,336,056 B1 2/2008 Dening
7,471,155 B1 12/2008 Levesque
(Continued)

FOREIGN PATENT DOCUMENTS

CN 201805351 4/2011
CN 102055327 5/2011
(Continued)

OTHER PUBLICATIONS

U.S. Appl. No. 17/060,873, filed Oct. 1, 2020, Ng, et al.
(Continued)

*Primary Examiner* — Hieu P Nguyen
(74) *Attorney, Agent, or Firm* — Knobbe, Martens, Olson & Bear, LLP

(57) ABSTRACT

A power management integrated circuit (PMIC) can improve the ramp up speed of a boost converter with the inclusion of a controllable switch that may modify the connection of an output capacitor to reduce the ramp time as the output voltage is ramping to a desired boost setpoint. The switch may be controlled using jump start logic to switch a first plate or terminal of the output capacitor from a ground connection to a voltage supply connection. Once a threshold voltage is reached, the first plate of the capacitor may be switched from the supply voltage to ground. In certain cases, by switching the connection of the output capacitor between ground and a supply voltage based on one or more threshold voltages or a boost setpoint, the time to ramp from an initial voltage to a desired boost setpoint may be reduced.

20 Claims, 14 Drawing Sheets

(51) Int. Cl.
    *H02M 1/14* (2006.01)
    *H02M 3/157* (2006.01)
    *H04B 1/40* (2015.01)
    *H02M 3/158* (2006.01)
    *H03F 3/24* (2006.01)
    *H04B 1/04* (2006.01)

(52) U.S. Cl.
    CPC ............... *H03F 3/20* (2013.01); *H03F 3/24* (2013.01); *H04B 1/04* (2013.01); *H04B 1/40* (2013.01); *H03F 2200/451* (2013.01)

(58) Field of Classification Search
    CPC ........ H03F 1/0266; H03F 3/195; H03F 3/245; H02M 1/143; H02M 3/157; H02M 3/158; H02M 1/36; H04B 1/04; H04B 1/40; H04B 2001/0408
    USPC .......................................... 330/296–297, 285
    See application file for complete search history.

(56) References Cited

U.S. PATENT DOCUMENTS

| | | | |
|---|---|---|---|
| 8,401,500 | B1 | 3/2013 | Bauder et al. |
| 9,584,012 | B2 | 2/2017 | Ng et al. |
| 10,135,339 | B1 | 11/2018 | Rosenbaum et al. |
| 10,420,042 | B2 | 9/2019 | Ng et al. |
| 11,258,408 | B2 * | 2/2022 | Henzler ............... H03F 1/0227 |
| 2003/0205991 | A1 | 11/2003 | McDonald et al. |
| 2006/0250115 | A1 | 11/2006 | Johnson |
| 2009/0207770 | A1 | 8/2009 | Fayfield et al. |
| 2009/0295355 | A1 | 12/2009 | Hirahara |
| 2011/0109292 | A1 | 5/2011 | Jang |
| 2011/0134665 | A1 | 6/2011 | Ivanov |
| 2013/0217345 | A1 | 8/2013 | Balteanu et al. |
| 2014/0111276 | A1 | 4/2014 | Mathe et al. |
| 2014/0210559 | A1 | 7/2014 | Mathe et al. |
| 2015/0077082 | A1 | 3/2015 | Kilic |
| 2015/0229202 | A1 | 8/2015 | Varigonda |
| 2016/0191001 | A1 | 6/2016 | Ripley et al. |
| 2016/0241143 | A1 | 8/2016 | Ng et al. |
| 2017/0006544 | A1 | 1/2017 | Khlat et al. |
| 2017/0181106 | A1 | 6/2017 | Ng et al. |
| 2021/0104985 | A1 | 4/2021 | Ng et al. |

FOREIGN PATENT DOCUMENTS

| | | |
|---|---|---|
| CN | 104242623 | 12/2014 |
| CN | 104066234 | 8/2016 |
| EP | 2290794 | 3/2011 |
| KR | 10-2017-0037516 | 4/2017 |
| WO | WO 2013/176647 | 11/2013 |
| WO | WO 2016/131026 | 8/2016 |
| WO | WO 2021/067616 | 4/2021 |

OTHER PUBLICATIONS

International Search Report and Written Opinion for PCT/US2016/017913 dated Jun. 17, 2016.

International Search Report and Written Opinion for PCT/US2020/053829 dated Jan. 19, 2021.

Wendy Ng, U.S. Appl. No. 17/060,873, filed Oct. 1, 2020, Fast Ramping Power Amplifier Boost Converter.

\* cited by examiner

JUMP-START POWER AMPLIFIER BOOST CONVERTER

INCORPORATION BY REFERENCE TO ANY PRIORITY APPLICATIONS

This application claims priority to U.S. Provisional Application No. 62/910,310, which was filed on Oct. 3, 2019 and is titled "JUMP-START POWER AMPLIFIER BOOST CONVERTER;" and U.S. Provisional Application No. 62/910,314, which was filed on Oct. 3, 2019 and is titled "FAST RAMPING POWER AMPLIFIER BOOST CONVERTER," the disclosures of which are expressly incorporated by reference herein in their entirety for all purposes. Further, this application is being filed on Oct. 1, 2020, the same date as U.S. application Ser. No. 17/060,873, which is titled "FAST RAMPING POWER AMPLIFIER BOOST CONVERTER" and is hereby expressly incorporated by reference herein in its entirety for all purposes. Any and all applications, if any, for which a foreign or domestic priority claim is identified in the Application Data Sheet of the present application are hereby incorporated by reference in their entireties under 37 CFR 1.57.

BACKGROUND

Technical Field

The present disclosure relates to power amplifiers. More specifically, the present disclosure relates to a boost converter for providing power to a high-voltage power amplifier.

Description of the Related Art

Power amplifiers (PAs) are widely used in various communication networks to set or increase the transmission power level of an information-bearing signal transmitted by one device to another device. For example, power amplifiers are used to set the pulse energy emitted by pulsed lasers in optical communication networks. Power amplifiers may be used in the radio frequency (RF) front-end components of wireless carrier network devices-such as base stations, repeaters, and mobile client devices (e.g., mobile phones, smartphones, tablet computers, etc.)—to set the power level of a wireless signal transmitted through an antenna. PAs may be used in local area networks of homes and offices to support both wired and wireless connectivity of servers, computers, laptops, and peripheral devices such as photocopiers and printers.

SUMMARY

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain aspects of the present disclosure relate to a voltage boost assembly. The voltage boost assembly may include a boost converter having a capacitive element arranged at an output, a first plate of the capacitive element connectable to a power amplifier; and a jump-start circuit configured to connect a second plate of the capacitive element to a ground when a boost setpoint of the boost converter is a first threshold voltage below an output voltage of the boost converter and configured to connect the second plate of the capacitive element to a supply voltage when the boost setpoint of the boost converter satisfies a second threshold voltage. The first threshold and the second threshold may depend on one or more of the boost output setpoint, the actual output voltage, and/or the actual input voltage. In some cases, the first threshold voltage and the second threshold voltage may be the same. In other cases, the first threshold voltage and the second threshold voltage may differ. By having different threshold voltages for determining when to connect the capacitive element to a supply voltage and when to connect the capacitive element to ground, switch bouncing is reduced or eliminated.

In some aspects, the voltage boost assembly may further include a sensing circuit configured to determine the output voltage of the boost converter. In some cases, the first threshold voltage is set at 3 volts. Further, the jump-start circuit may connect the second plate of the capacitive element to the supply voltage when the boost setpoint is at or above 8 volts and/or three times of the input voltage. The jump-start circuit may include a first switch configured to connect the second plate to one of the ground or the supply voltage. The first switch may have an impedance of 100 milliohm. Further, the first switch may be a field-effect transistor. Moreover, the first switch may create a 100 milliohm equivalent series resistance. In some implementations, the jump-start circuit includes jump-start logic configured to control the first switch and the second switch based at least in part on the boost setpoint of the boost converter, the actual boost output voltage and input voltage. In addition, the second switch may have an impedance of 100 milliohms. In some cases, the jump-start circuit further includes an interface circuit configured to receive a specification of the boost setpoint. Moreover, the interface circuit may implement a MIPI Specification.

Additional aspects of the present disclosure relate to a power amplifier module. The power amplifier module may include a power amplifier and a voltage boost assembly configured to supply a voltage to the power amplifier. The voltage boost assembly may include a boost converter and a jump-start circuit, the boost converter having a capacitive element arranged at an output of the voltage boost assembly, a first plate of the capacitive element connected to the power amplifier, and the jump-start circuit configured to connect a second plate of the capacitive element to a ground when a boost setpoint of the boost converter is a first threshold voltage below an output voltage of the boost converter output and configured to connect the second plate of the capacitive element to a supply voltage when the boost setpoint of the boost converter satisfies a second threshold voltage.

In some aspects, the voltage boost assembly further includes a sensing circuit configured to determine the output voltage of the boost converter. Further, the jump-start circuit may include a first switch configured to connect the second plate to one of the ground or the supply voltage based at least in part on the output voltage of the boost converter. In some cases, the first switch forms a substantially 100 milliohm equivalent series resistance. Moreover, the jump-start circuit may include jump-start logic configured to control the first switch based at least in part on the boost setpoint of the boost converter. Further, the voltage boost assembly includes a second switch configured to connect a 2G bias supply output between the ground and the supply voltage.

Yet further aspects of the present disclosure relate to a wireless device that includes a transceiver configured to transmit one or more radio frequency signals via an antenna and a power amplifier module configured to amplify the one or more radio frequency signals prior to transmission by the transceiver. Further, the power amplifier module may include a power amplifier and a voltage boost assembly configured to supply a voltage to the power amplifier. The voltage boost assembly can include a boost converter and a jump-start circuit. The boost converter may have a capacitive element arranged at an output of the voltage boost assembly and a first plate of the capacitive element connected to the power amplifier. Further, the jump-start circuit may be configured to connect a second plate of the capacitive element to a ground when a boost setpoint of the boost converter is a first threshold voltage below an output voltage of the voltage boost assembly and may be configured to connect the second plate of the capacitive element to a supply voltage when the boost setpoint of the boost converter satisfies a second threshold voltage.

Certain additional aspects of the present disclosure relate to a voltage boost assembly. The voltage boost assembly may include a boost converter having a capacitive element arranged at an output, a first plate of the capacitive element connectable to a power amplifier; a quick start assembly configured to drive the boost converter at a high duty-cycle such that the boost converter delivers an output current that satisfies a threshold current to charge the capacitive element arranged at the output; and a jump-start circuit configured to switch a connection of a second plate of the capacitive element between a ground and a supply voltage based at least in part on a determination of a boost setpoint of the boost converter satisfying a threshold voltage.

In some aspects, the voltage boost assembly further includes a sensor assembly configured to generate a quick-start enable signal in response to detecting that an electrical condition of the output of the boost converter exceeds a quick-start threshold. Further, the quick start assembly drives the boost converter at the high duty-cycle responsive to the quick-start enable signal. In some cases, the high duty-cycle exceeds fifty percent. Further, the high duty-cycle may be between 90% and 100%. Moreover, the voltage boost assembly may include a sensing circuit configured to determine an output voltage of the boost converter. The jump-start circuit may connect the second plate of the capacitive element to the ground when the output voltage is a threshold level above the boost setpoint. Further, the jump-start circuit may connect the second plate of the capacitive element to the supply voltage when the boost setpoint satisfies the threshold voltage.

Some implementations of the jump-start circuit include a low impedance switch that switches the connection of the second plate of the capacitive element between the ground and the supply voltage. In some such cases, the low impedance switch forms a 100 milliohm equivalent series resistance. Moreover, in certain aspects, the voltage boost assembly includes a second low impedance switch configured to connect a 4.5 volt bias supply output between the ground and the supply voltage. In addition, the quick start assembly may include a charging circuit configured to charge the capacitive element such that an output of an error amplifier satisfies a duty cycle threshold. Further, the quick-start assembly may include a saturation limiting circuit configured to limit current through an inductive element based on a saturation condition of the inductive element, the inductive element connected at a supply voltage input. Moreover, the quick-start assembly may include a ripple control module configured to reduce current ripple in the output current by adjusting a switching frequency in response to a quick-start enable signal.

Additional aspects of the present disclosure relate to a power amplifier module. The power amplifier module may include a power amplifier and a voltage boost assembly configured to supply a voltage to the power amplifier. The voltage boost assembly may include a boost converter, a quick start assembly, and a jump-start circuit, the boost converter having a capacitive element arranged at an output with a first plate of the capacitive element connectable to a power amplifier, the quick start assembly configured to drive the boost converter at a high duty-cycle to deliver an output current that satisfies a threshold current to charge the capacitive element arranged at the output, and the jump-start circuit configured to switch a connection of a second plate of the capacitive element between a ground and a supply voltage based at least in part on a determination of a boost setpoint of the boost converter satisfying a threshold voltage.

In some aspects, the jump-start circuit may include a switch implemented with two MOSFETs that form substantially 100 milliohm equivalent series resistance and is configured to connect the second plate to one of the ground or the supply voltage based at least in part on an output voltage of the boost converter. Only one MOS is on at a time. Further, the voltage boost assembly may include a switch that forms a substantially 100 milliohm equivalent series resistance and is configured to connect a bias supply output between the ground and the supply voltage. Moreover, the quick-start assembly may include a saturation limiting circuit configured to limit current through an inductive element based on a saturation condition of the inductive element, the inductive element connected at a supply voltage input. In some implementations, the quick-start assembly includes a ripple control module configured to reduce current ripple in the output current by adjusting a switching frequency of an oscillator included in the quick-start assembly.

Yet additional aspects of the present disclosure relate to a wireless device. The wireless device may include a transceiver configured to transmit one or more radio frequency signals via an antenna; and a power amplifier module configured to amplify the one or more radio frequency signals prior to transmission by the transceiver. The power amplifier module can include a power amplifier and a voltage boost assembly configured to supply a voltage to the power amplifier. The voltage boost assembly can include a boost converter, a quick start assembly, and a jump-start circuit. The boost converter may have a capacitive element arranged at an output with a first plate of the capacitive element connectable to a power amplifier, the quick start assembly may be configured to drive the boost converter at a high duty-cycle to deliver an output current that satisfies a threshold current to charge the capacitive element arranged at the output, and the jump-start circuit may be configured to switch a connection of a second plate of the capacitive element between a ground and a supply voltage based at least in part on a determination of a boost setpoint of the boost converter satisfying a threshold voltage.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

DETAILED DESCRIPTION

Introduction

Figure 1:
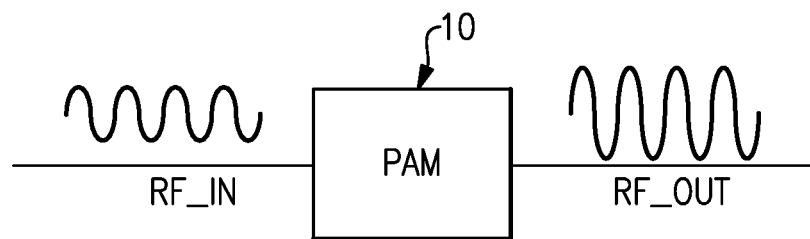
FIG. 1 is a schematic diagram of a power amplifier module for amplifying a radio frequency (RF) signal.

A power management system can be used to generate a supply voltage that has a programmable voltage level. For example, a power management system can be used to generate a programmable supply voltage for a power amplifier. Additionally, the voltage level of the power amplifier supply voltage can be changed over time to improve the power amplifier's power added efficiency (PAE).

A transient response of the power management system can be important. For example, in wireless device applications, a supply voltage generated by a power management system may be specified to settle to a programmed voltage level in less than a certain amount of time, for instance, about 5 µs.

In some implementations, power amplifiers (PAs) use a boost converter for DC-to-DC power conversion when the PAs output voltage should be, or is desired to be, greater than its input voltage. Typically, a boost converter with a compensated error-amplifier has an intrinsic soft-start feature that causes a gradual increase in current. With the capacitor at the error-amplifier output slowly being charged up, the duty cycle of the boost is slowly increased, leading to a slow increase of the boost output voltage. In some implementations, in order to use a boost converter to power a high-voltage PA, the boost converter is specified to ramp up at a rate of 570 mV/µs in order to avoid any signal distortion at the output of the PA. The fast ramp-rate of the boost output voltage may limit the value of the output capacitor and pose a design challenge due to the slow soft-start nature of the error amplifier, which has a gradual current increase at startup.

Embodiments disclosed herein present a power management integrated circuit (PMIC) that improves the ramp up speed of a boost converter compared to existing boost converters. In some implementations disclosed herein, the ramp up speed may be increased by a factor of two. Certain implementations include a controllable switch that is capable of modifying the connection of the output capacitor to reduce the ramp time as the output voltage is ramping to a desired boost setpoint. The switch may be controlled using jump start logic to switch a bottom (or first) plate or terminal of the output capacitor from a ground connection to a voltage supply connection. The connection of the output capacitor between the output and the supply voltage may be maintained until the output voltage achieves a threshold voltage. Once the threshold voltage is reached, the first plate of the capacitor that is connected to the supply voltage may be connected to ground. The top (or second) plate or terminal of the capacitor may remain connected to an output pin or node. The jump start logic may control the configuration of the switch based on one or more thresholds and/or a boost setpoint. Advantageously, in certain embodiments, by switching the connection of the output capacitor between ground and a supply voltage based on the one or more threshold or the boost setpoint, the time to ramp from an initial voltage to a desired boost setpoint may be reduced.

Example Power Amplifier

As indicated above, the output of the PMIC may be supplied to a power amplifier and/or a power amplifier controller. FIG. 1 is a schematic diagram of a power amplifier module (PAM) 10 for amplifying a radio frequency (RF) signal. The illustrated power amplifier module 10 amplifies an RF signal (RF_IN) to generate an amplified RF signal (RF_OUT). The power amplifier module 10 can include and/or may receive a supply voltage from a power management integrated circuit implemented using one or more features of the present disclosure.

Example Wireless Device

Figure 2:
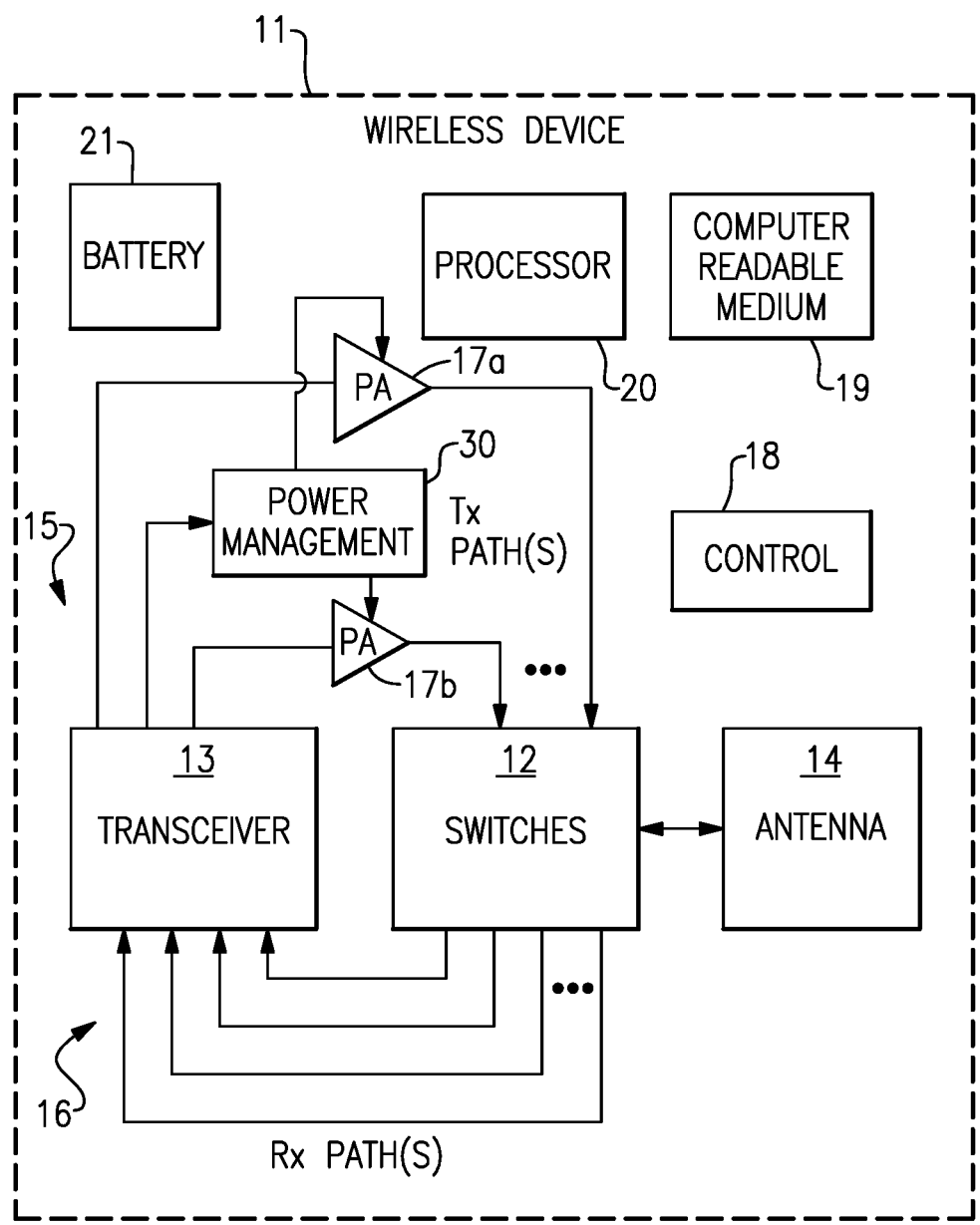
FIG. 2 is a schematic diagram of an example wireless device.

FIG. 2 is a schematic block diagram of an example wireless or mobile device 11. The wireless device 11 can include a power management integrated circuit implemented using one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, 22 or more bands.

One or more features of the present disclosure can be implemented in the foregoing example modes and/or bands, and in other communication standards. For example, 802.11, 2G, 3G, 4G, LTE, and Advanced LTE are non-limiting examples of such standards. To increase data rates, the wireless device 11 can operate using complex modulated signals, such as 64 QAM signals.

In certain embodiments, the wireless device 11 can include switches 12, a transceiver 13, an antenna 14, power amplifiers 17a, 17b, a control component 18, a computer readable medium 19, a processor 20, a battery 21, and a power management system 30.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can operate using different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17a, 17b shown can represent amplifications associated with different power output configurations (e.g., low power output and high power output), and/or amplifications associated with different bands. Although FIG. 2 illustrates a configuration using two transmission paths 15 and two power amplifiers 17a, 17b, the wireless device 11 can be adapted to include more or fewer transmission paths 15 and/or more or fewer power amplifiers.

In FIG. 2, one or more detected signals from the antenna 14 are depicted as being provided to the transceiver 13 via one or more receiving paths 16. In the example shown, different receiving paths 16 can represent paths associated with different bands. For example, the four example receiving paths 16 shown can represent quad-band capability that some wireless devices are provided with. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17a, 17b, the power management system 30, and/or other operating components.

In certain embodiments, a processor 20 can be configured to facilitate implementation of various processes described herein. The processor 20 can implement various computer program instructions. The processor 20 can be a general purpose computer, special purpose computer, or other programmable data processing apparatus.

In certain embodiments, these computer program instructions may also be stored in a computer-readable memory 19 that can direct the processor 20 to operate in a particular manner, such that the instructions stored in the computer-readable memory 19.

The illustrated wireless device 11 also includes the power management system 30, which can be used to provide power amplifier supply voltages to one or more of the power amplifiers 17a, 17b. For example, the power management system 30 can be configured to change the supply voltages provided to the power amplifiers 17a, 17b to improve efficiency, such as power added efficiency (PAE). The power management system 30 can be used to provide average power tracking (APT) and/or envelope tracking (ET). Furthermore, the power management system 30 can include one or more LDO regulators used to generate power amplifier supply voltages for one or more stages of the power amplifiers 17a, 17b. In the illustrated implementation, the power management system 30 is controlled using a power control signal generated by the transceiver 13. In certain configurations, the power control signal is provided by the transceiver 13 to the power management system 30 over an interface, such as a serial peripheral interface (SPI) or Mobile Industry Processor Interface (MIPI).

In certain configurations, the wireless device 11 may operate using carrier aggregation. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Example Power Amplifier System

Figure 3:
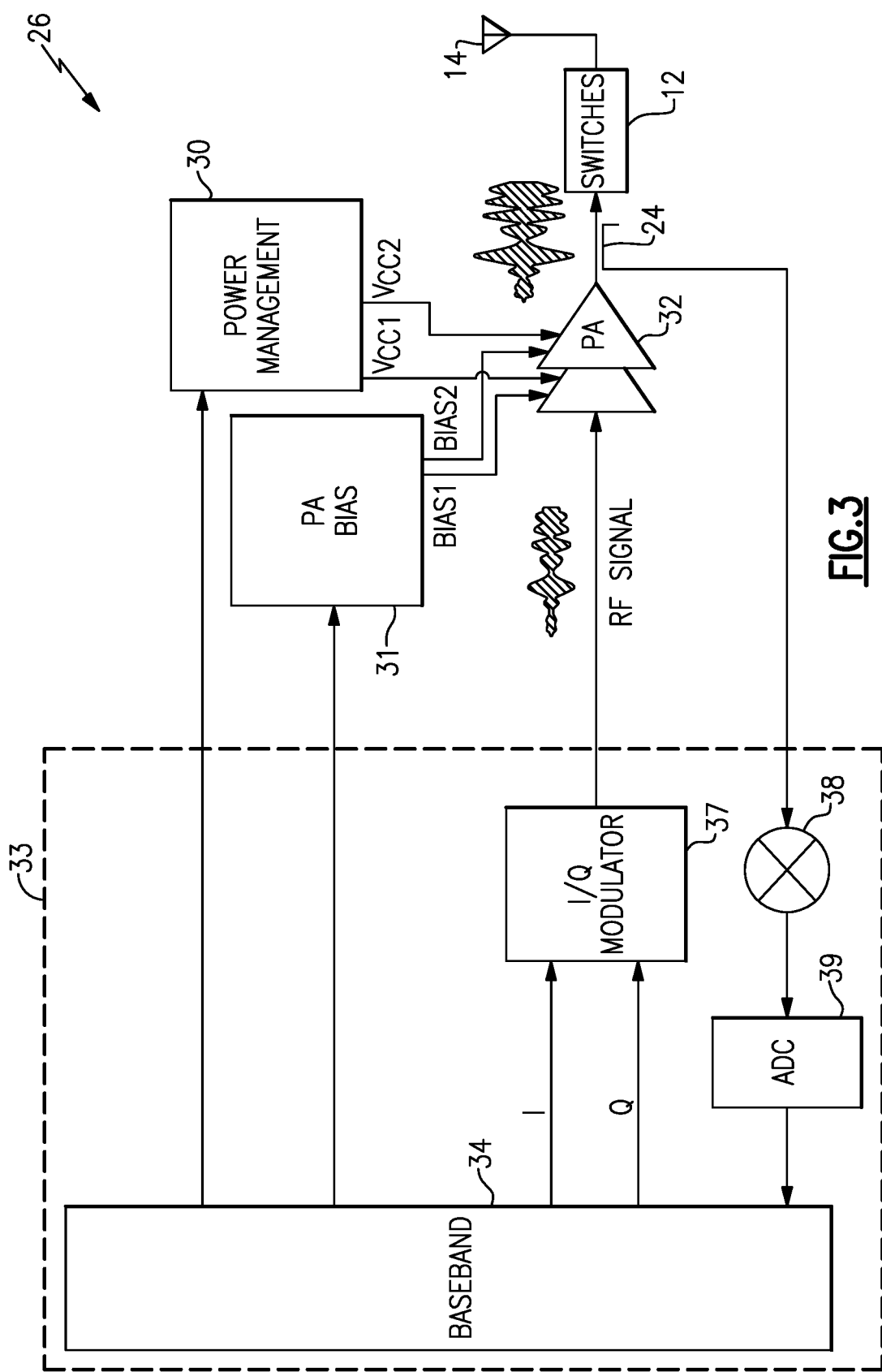
FIG. 3 is a schematic diagram of one embodiment of a power amplifier system.

FIG. 3 is a schematic block diagram of one example of a power amplifier system 26. The illustrated power amplifier system 26 includes the switches 12, the antenna 14, a directional coupler 24, a power management system 30, a power amplifier bias circuit 31, a power amplifier 32, and a transceiver 33. The illustrated transceiver 33 includes a baseband processor 34, an I/Q modulator 37, a mixer 38, and an analog-to-digital converter (ADC) 39. Although not illustrated in FIG. 3 for clarity, the transceiver 33 can include circuitry associated with receiving signals over one or more receive paths.

The baseband signal processor 34 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate an RF signal. For example, the I/Q modulator 37 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 32. In certain implementations, the I/Q modulator 37 can include one or more filters configured to filter frequency content of signals processed therein.

The power amplifier bias circuit 31 receives a bias control signal from the transceiver 33, and generates one or more bias signals for the power amplifier 32. In the illustrated configuration, the power amplifier bias circuit 31 generates a first bias signal BIAS1 for biasing a driver stage of the power amplifier 32 and a second bias signal BIAS2 for biasing an output stage of the power amplifier 32. The bias signals BIAS1, BIAS2 can include current and/or voltage signals, and can be used, for example, to bias bases of bipolar transistors and/or gates of field-effect transistors associated with the power amplifier's stages. In certain configurations, the transceiver 33 can control the bias signals generated by the power amplifier bias circuit 31 to enhance the PAE of the power amplifier system 26. In one embodiment, the transceiver 33 controls each of the first and second bias signals BIAS1, BIAS2 to one of a multiple settings based on at least one of a frequency band of operation or a power mode (for example, high power mode, medium power mode, or low power mode).

The power amplifier 32 can receive the RF signal from the I/Q modulator 37 of the transceiver 33, and when enabled can provide an amplified RF signal to the antenna 14 via the switches 12. The directional coupler 24 can be positioned between the output of the power amplifier 32 and the input of the switches 12, thereby allowing an output power measurement of the power amplifier 32 that does not include insertion loss of the switches 12. However, other configurations of power measurement are possible.

In the illustrated configuration, the sensed output signal from the directional coupler 24 is provided to the mixer 38, which multiplies the sensed output signal by a reference signal of a controlled frequency. The mixer 38 operates to generate a downshifted signal by downshifting the sensed output signal's frequency content. The downshifted signal can be provided to the ADC 39, which can convert the downshifted signal to a digital format suitable for processing by the baseband processor 34. By including a feedback path between the output of the power amplifier 32 and the baseband processor 34, the baseband processor 34 can be configured to dynamically adjust the I and Q signals to optimize the operation of the power amplifier system 26. For example, configuring the power amplifier system 26 in this manner can aid in controlling the PAE and/or linearity of the power amplifier 32. However, other configurations of power control can be used.

The power management system 30 receives a power control signal from the transceiver 33, and generates one or more power amplifier supply voltages for the power amplifier 32. In the illustrated configuration, the power management system 30 generates a first power amplifier supply voltage $V_{CC1}$ for powering a driver stage of the power amplifier 32 and a second power amplifier supply voltage $V_{CC2}$ for powering an output stage of the power amplifier 32. In certain configurations, the transceiver 33 can control the voltage levels of the power amplifier supply voltages $V_{CC1}$, $V_{CC2}$ to enhance the power amplifier system's PAE.

Example Voltage Boost Assembly

Figure 4:
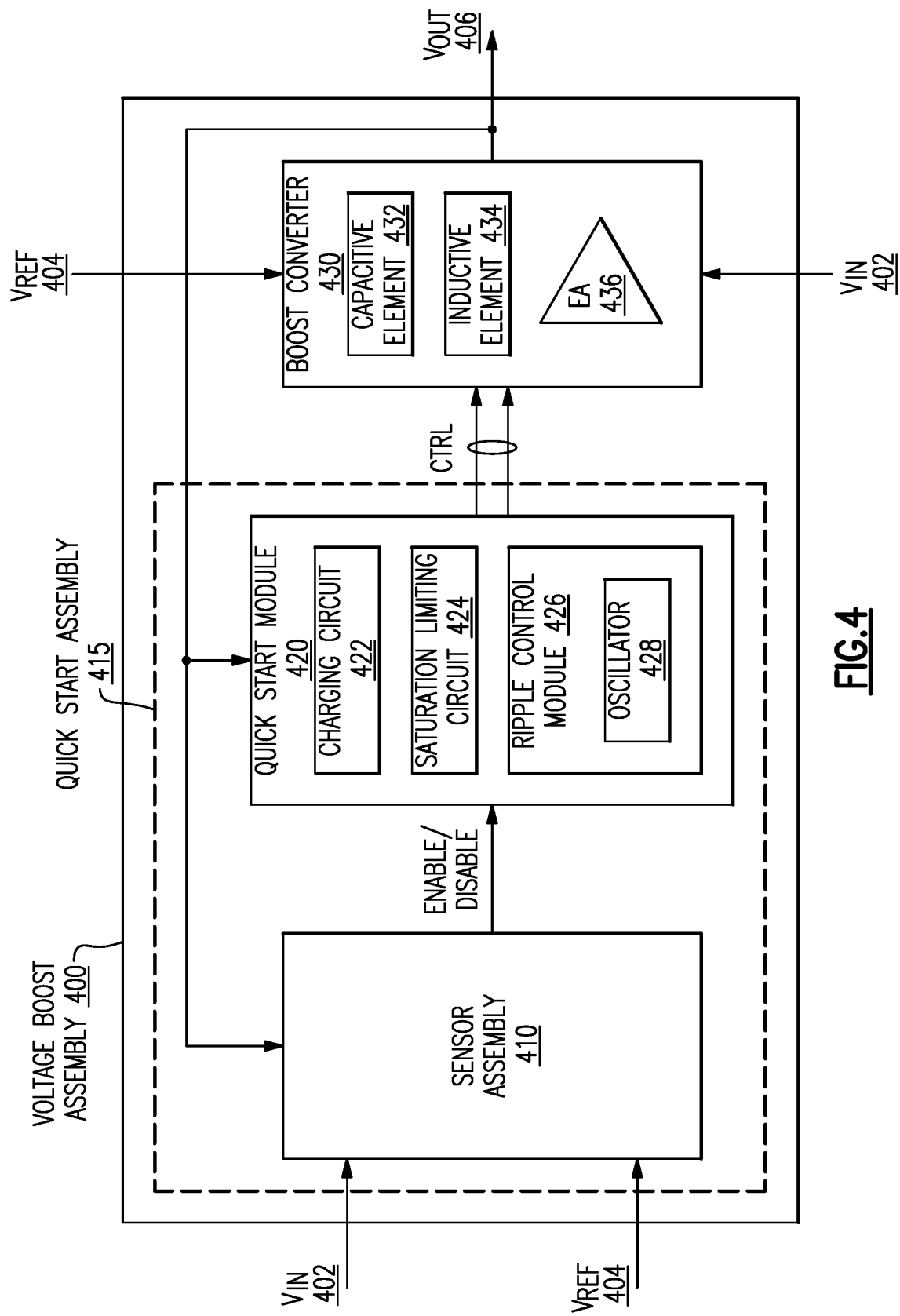
FIG. 4 is a block diagram of a voltage boost assembly according to some implementations.

FIG. 4 is a block diagram of a voltage boost assembly 400 according to some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, in some implementations, the voltage boost assembly 400 includes a quick-start assembly 415 and a boost converter 430. According to some implementations, the quick-start assembly 415 includes a sensor assembly 410 and a quick-start module 420.

In some implementations, the sensor assembly 410 is configured to provide an enable signal to the quick-start module 420 when one or more predetermined quick-start enable conditions are satisfied. In one example, the quick-start enable conditions are satisfied when $V_{IN}$ 402<$V_{REF}$ 404 and 0.8*$V_{REF}$ 404>$V_{OUT}$ 406. In some implementations, the sensor assembly 410 is configured to provide a disable signal to the quick-start module 420 when one or more predetermined quick-start disable conditions are satisfied. In one example, the quick-start disable conditions are satisfied when 0.95*$V_{REF}$ 404<$V_{OUT}$ 406 or $V_{IN}$ 402>$V_{REF}$ 404.

In some implementations, the quick-start module 420 includes a charging circuit 422, a saturation limiting circuit 424, and a ripple control module 426. In some implementations, the boost converter 430 includes a capacitive element 432, an inductive element 434, and an error amplifier 436. In some implementations, the inductive element 434 is provided to establish an output current level.

According to some implementations, the charging circuit 422 is configured to force the output of the error amplifier 436 to satisfy a predefined value (e.g., 1.1 V or 1.2 V). For example, in some implementations, this forces the error amplifier 436 to run at a duty cycle that satisfies a predefined threshold (e.g., 100% or maximum duty cycle). According to some implementations, the saturation limiting circuit 424 is configured to set a limit of the current flowing through the inductive element 434 to a predetermined output level (e.g., 2.5 A). For example, in some implementations, this prevents saturation of the inductive element 434. According to some implementations, the ripple control module 426 is configured to increase the switching frequency of an oscillator 428 above a predetermined switching frequency (e.g., from 2 MHz to 2.5 MHz). For example, in some implementations, this reduces ripple in the current flowing through the inductive element 434.

Figure 5:
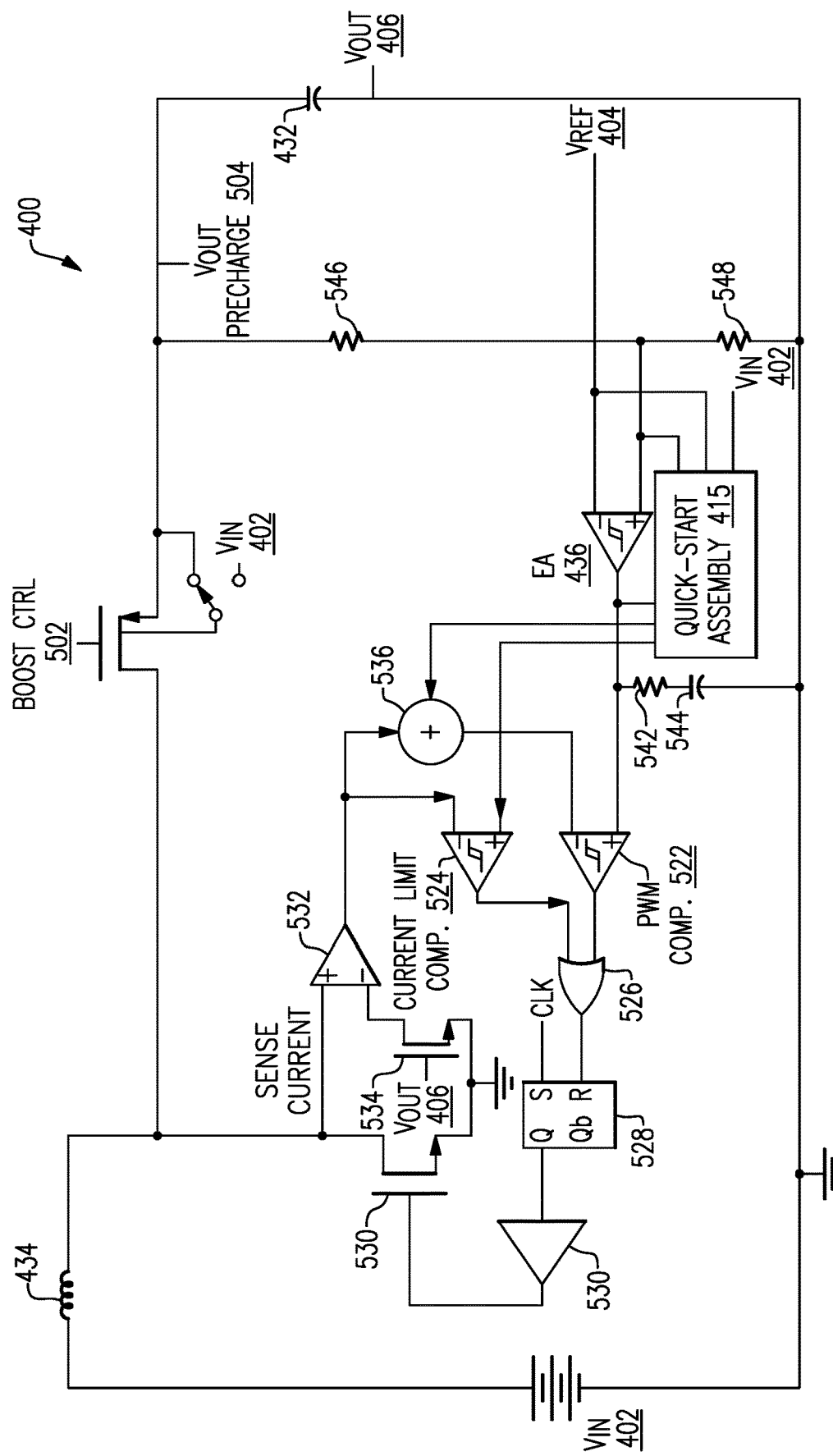
FIG. 5 is a schematic diagram of the voltage boost assembly in FIG. 4 according to some implementations.

FIG. 5 is a schematic diagram of the voltage boost assembly 400 in FIG. 4 according to some implementations. While pertinent features are shown, those of ordinary skill in the art will appreciate from the present disclosure that various other features have not been illustrated for the sake of brevity and so as not to obscure more pertinent aspects of the example implementations disclosed herein. In some implementations, the voltage boost assembly 400 includes resistive elements 546 and 548, $V_{OUT}$ precharge 504 (e.g., the output voltage prior to the capacitive element 432), and $V_{OUT}$ 406 (e.g., the output voltage after the capacitive element 432). In some implementations, the voltage boost assembly 400 includes a boost control 502 associated with a p-channel field-effect transistor (PFET) (e.g., with $R_{ds}$=0.27Ω), which acts as a switch to enable and disable the voltage boost assembly 400. According to some implementations, the value of the inductive element 434 is, for example, 1.5 pH, and the value of the capacitive element 432 is, for example, 1 μF.

In some implementations, the quick-start assembly 415 is coupled with the output of error amplifier 436. For example, as discussed above with reference to FIG. 4, the quick-start assembly 415 or a component thereof (e.g., the charging circuit 422 in FIG. 4) is configured to force the output of the error amplifier 436 to satisfy a predefined value (e.g., 1.1 V or 1.2 V).

Further, in some implementations, the quick-start assembly 415 provides an input to current limit comparator 524. For example, as discussed above with reference to FIG. 4, the quick-start assembly 415 or a component thereof (e.g., the saturation limiting circuit 424 in FIG. 4) is configured to set a limit of the current flowing through the inductive element 434 to a predetermined output level (e.g., 2.5 A).

As shown in FIG. 5, in some implementations, the quick-start assembly 415 provides an input to summation element 536 to compensate for the oscillator slope. For example, as discussed above with reference to FIG. 4, the quick-start assembly 415 or a component thereof (e.g., the ripple control module 426 in FIG. 4) is configured to increase the switching frequency above a predetermined switching frequency (e.g., from 2 MHz to 2.5 MHz).

Moreover, in some implementations, the output of the error amplifier 436 provides an input to pulse-width modulation (PWM) comparator 522. The output of the error amplifier 436 is also coupled with a shunt resistance element 542 (e.g., 80 kΩ) and a shunt capacitance element 544 (e.g., 100 μF), which are connected in series to ground. The output of the PWM comparator 522 provides an input to OR gate 526, and the output of the current limit comparator 524 provides another input to the OR gate 526.

In some implementations, the output of the OR gate 526 provides an input to SR latch 528 (e.g., the R input) along with a clock (CLK) signal (e.g., the S input). The output of the SR latch 528 (e.g., the Q output) provides an input to a driver amplifier 530. The output of the driver amplifier 530 is coupled with the gate of an n-channel field-effect transistor (NFET) (e.g., with $R_{ds}$=0.15Ω) 530. The source of the NFET 530 is coupled with the output of the inductive element 434, and the drain of the NFET 530 is coupled with ground.

As shown in FIG. 5, in some implementations, the output of the inductive element 434 provides an input to differential amplifier 532. The source of NFET 534 provides another input to the differential amplifier 532. As shown in FIG. 5, in some implementations, the gate of NFET 534 is coupled with $V_{OUT}$ 406, and the drain of NFET 534 is coupled with ground. The output of the differential amplifier 532 provides an input to the current limit comparator 524 and the summation element 536.

Example Quick-Start Assembly

Figure 6:
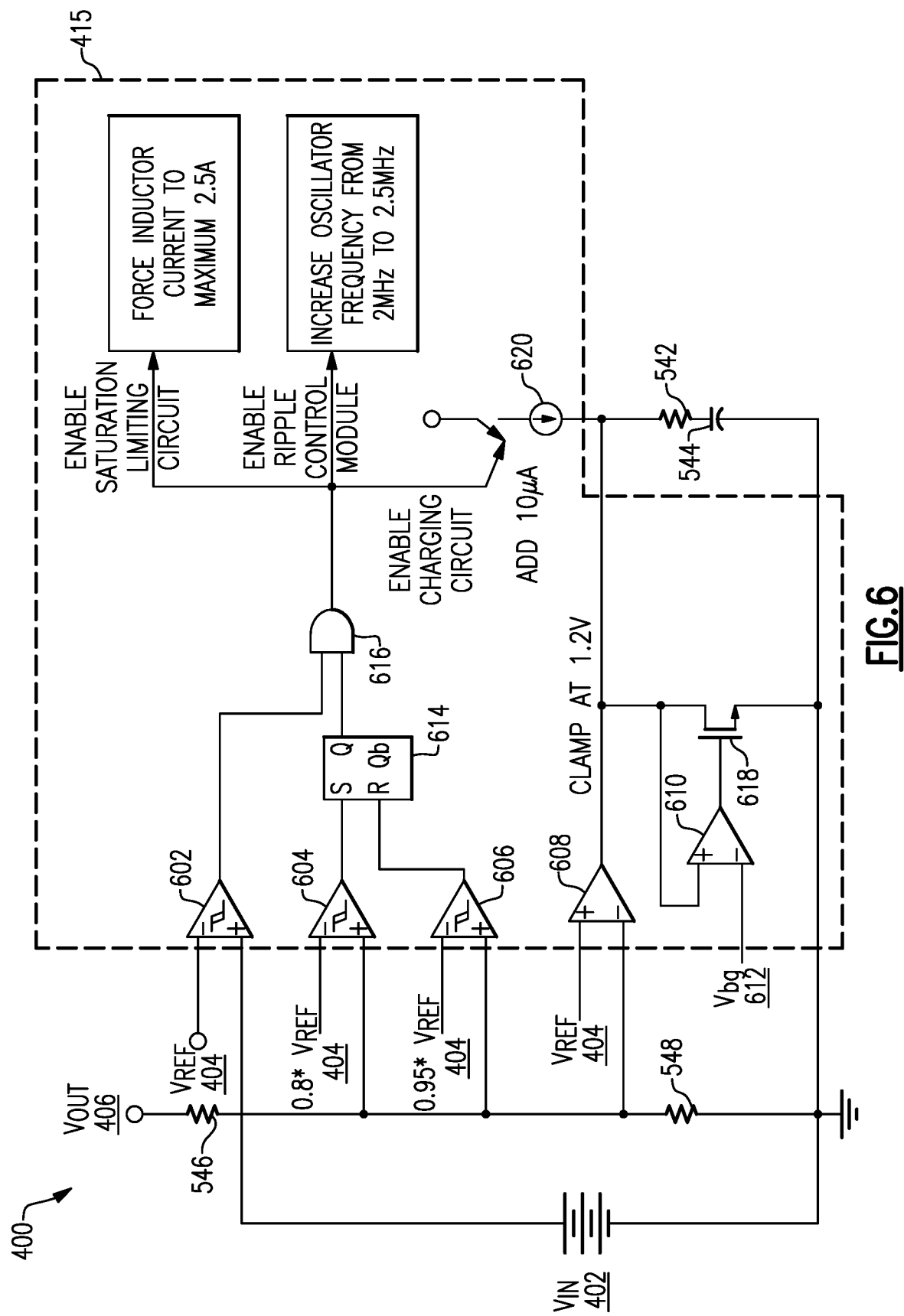
FIG. 6 is a schematic diagram of a portion of the voltage boost assembly in FIG. 4 according to some implementations.

FIG. 6 is a schematic diagram of a portion of the voltage boost assembly 400 in FIG. 4 according to some implementations. While pertinent features are shown, those of ordinary skill in the art will appreciate from the present disclosure that various other features have not been illustrated for the sake of brevity and so as not to obscure more pertinent aspects of the example implementations disclosed herein. In some implementations, the quick-start assembly 415 includes: comparators 602, 604, and 606; differential amplifiers 608 and 610; SR latch 614; AND gate 616; NFET 618; and current source 620.

As shown in FIG. 6, in some implementations, the comparators 604 and 606 provide inputs to the SR latch 614 (e.g., the S and R inputs, respectively). As shown in FIG. 6, in some implementations, the comparator 602 and the SR latch 614 (e.g., the Q output) provide inputs to the AND gate 616. When $V_{IN}$ 402<$V_{REF}$ 404 and 0.8*$V_{REF}$ 404>$V_{OUT}$ 406, the output of the AND gate 616 is logic high (e.g., 1) and the voltage boost assembly 400 operates under quick-start parameters. Under quick-start parameters, (A) the current flowing through the inductive element 434 is set to a predetermined output level (e.g., 2.5 A), (B) the switching frequency is increased above a predetermined switching frequency (e.g., from 2 MHz to 2.5 MHz), and (C) the current source 620 supplies a predefined current (e.g., 10 μA) so that the output of the error amplifier 436 to satisfy a predefined value (e.g., 1.1 V or 1.2 V). When $V_{IN}$ 402>$V_{REF}$ 404 or 0.95*$V_{REF}$ 404<$V_{OUT}$ 406, the output of the AND gate 616 is logic low (e.g., 0) and the voltage boost assembly 400 operates under regular parameters.

As shown in FIG. 6, in some implementations, $V_{REF}$ 404 and $V_{OUT}$ 406 provide inputs to the differential amplifier 608. The output of the differential amplifier 608 and $V_{bg}$ 612 provide inputs to the differential amplifier 610. The output of the differential amplifier 610 is coupled to the gate of NFET 618. In other words, in one example, the NFET 618 and differential amplifiers 608 and 610 clamp the output of the error amplifier 436 at 1.2 V.

Performance Measurements

Figure 7:
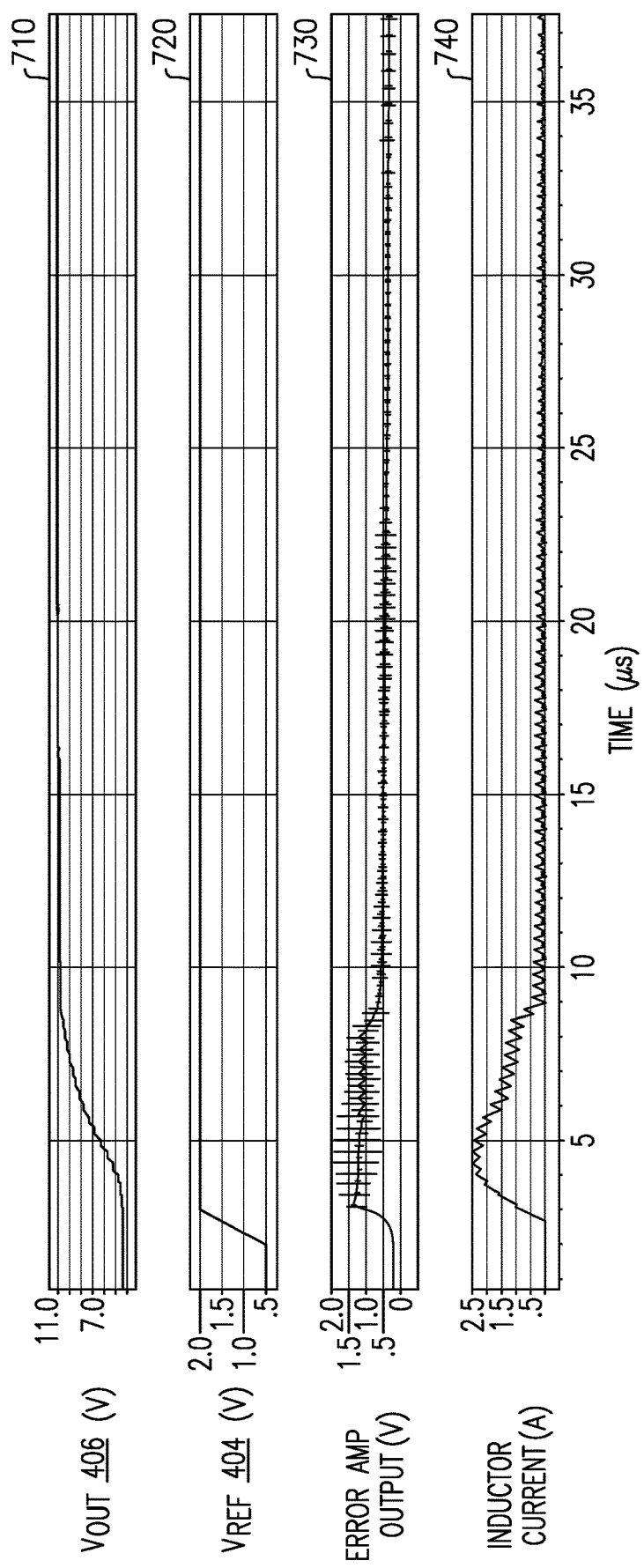
FIG. 7 shows example performance plots of the voltage boost assembly in FIG. 4 according to some implementations.

FIG. 7 shows example performance plots of the voltage boost assembly 400 in FIG. 4 according to some implementations. While pertinent features are shown, those of ordinary skill in the art will appreciate from the present disclosure that various other features have not been illustrated for the sake of brevity and so as not to obscure more pertinent aspects of the example implementations disclosed herein. To that end, in some implementations, example performance plot 710 shows $V_{OUT}$ 406 over time. For example, as shown in example performance plot 710, $V_{OUT}$ 406 increases from approximately 3.8 V to 9.5 V in approximately 10 μs.

According to some implementations, example performance plot 720 shows $V_{REF}$ 404 versus time. For example, as shown in example performance plot 720, $V_{REF}$ 404 increases from approximately 0.5 V to 2.0 V.

According to some implementations, example performance plot 730 shows the output voltage of the error amplifier 436 versus time. For example, as shown in example performance plot 730, the output voltage of the error amplifier 436 is clamped at 1.2 V during the quick-start period between 5 and 10 μs.

According to some implementations, example performance plot 740 shows the current flowing through the inductive element 434 versus time. For example, as shown in example performance plot 740, the current flowing through the inductive element 434 is limited to 2.5 A during the quick-start period between 5 and 10 μs.

Voltage Boost Process

Figure 8:
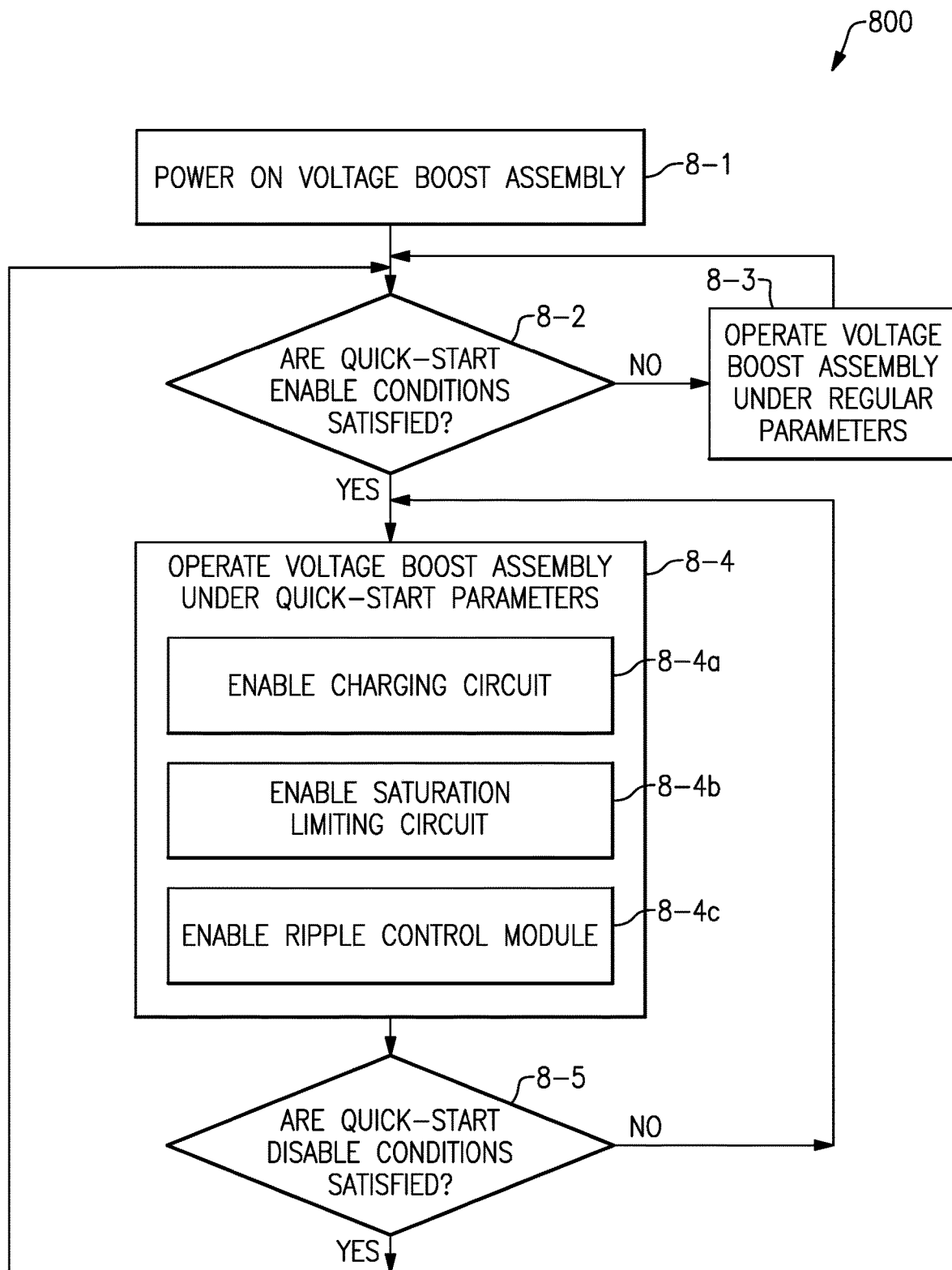
FIG. 8 is a flowchart representation of a method of operating the voltage boost assembly in FIG. 4 according to some implementations.

FIG. 8 is a flowchart representation of a process 800 of operating the voltage boost assembly 400 in FIG. 4 in accordance with some implementations. In some implementations, the process 800 is performed by the voltage boost assembly 400 in FIG. 4 or a controller associated therewith. While pertinent features are shown, those of ordinary skill in the art will appreciate from the present disclosure that various other features have not been illustrated for the sake of brevity and so as not to obscure more pertinent aspects of the example implementations disclosed herein. To that end, briefly, in some circumstances, the process 800 includes: powering on a voltage boost assembly; determining whether quick-start conditions are satisfied; operating the voltage boost assembly under regular parameters if the quick-start conditions are not satisfied; and operating the voltage boost assembly under quick-start parameters if the quick-start conditions are satisfied.

The process 800 may begin at block 8-1 where the process 800 includes powering on a voltage boost assembly. For example, with reference to FIG. 4, the voltage boost assembly 400 initiates operation when the associated device (e.g., a mobile phone or the like) is powered on. For example, with reference to FIG. 5, the voltage boost assembly 400 is powered on when the PFET associated with boost control 502 is in an "on" state, which allows current to flow from the inductive element 434 to the capacitive element 432.

As represented by block 8-2, the process 800 includes determining whether quick-start enable conditions are satisfied. For example, with reference to FIG. 4, the sensor assembly 410 senses whether an electrical condition relative to an electrical output of the boost converter (e.g., $V_{OUT}$ 406) has breached a first threshold. According to some implementations, for example, the quick-start enable conditions are satisfied when $V_{IN}$ 402<$V_{REF}$ 404 and 0.8*$V_{REF}$ 404>$V_{OUT}$ 406.

If the quick-start enable conditions are not satisfied, the process continues to block 8-3. If the quick-start enable conditions are satisfied, the process continues to block 8-4. For example, with reference to FIG. 4, the sensor assembly 410 generates a quick-start enable signal and provides the quick-start enable signal to the quick-start module 420 in response to sensing that the first threshold has been breached. According to some implementations, detecting that an electrical condition relative to an electrical output of the boost converter has breached the first threshold includes detecting that a reference voltage indicates demand for an output voltage that is at least 10% higher than the current output voltage. In some implementations, detecting that an electrical condition relative to an electrical output of the boost converter has breached the first threshold includes detecting that a reference voltage indicates demand for an output voltage that is at least 20% higher than the current output voltage. In another example, with reference to FIG. 6, when $V_{IN}$ 402<$V_{REF}$ 404 and 0.8*$V_{REF}$ 404>$V_{OUT}$ 406, the output of the AND gate 616 is logic high (e.g., 1) and the voltage boost assembly 400 operates under quick-start parameters.

As represented by block 8-3, the process 800 includes operating the voltage boost assembly under regular parameters. According to some implementations, when the voltage boost assembly 400 is operated under regular parameters it is operated according to conventional boost converter techniques.

As represented by block 8-4, the process 800 includes operating the voltage boost assembly under quick-start parameters. For example, with reference to FIG. 4, the quick-start module 420 is configured to drive the boost converter at a relatively high duty-cycle and so that the boost converter delivers an output current that satisfies a second threshold in order to charge a capacitive element arranged at the output in response to the quick-start enable signal. In some cases, the high duty-cycle may be between 90% and 100%. In other cases, the high duty-cycle may be less (e.g., 85%, 80%, or above 50%). According to some implementations, the second threshold is characterized by a current level available to charge the capacitive element.

According to some implementations, as represented by block 8-4a, the process 800 includes enabling the charging circuit. For example, with reference to FIG. 4, the quick-start module 420 includes a charging circuit 422 provided to charge the capacitive element 432 so that the output of an associated error amplifier satisfies a third threshold in response to the quick-start enable signal. According to some implementations, the third threshold is characterized in relation to a high voltage level that can be sustained at the output of the error amplifier. In some implementations, the charging circuit 422 is configured to force the output of the error amplifier 436 to satisfy a predefined value (e.g., 1.1 V or 1.2 V). For example, in some implementations, this forces the error amplifier 436 to run at a duty cycle that satisfies a predefined threshold (e.g., 100% or maximum duty cycle).

According to some implementations, as represented by block 8-4b, the process 800 includes enabling the saturation limiting circuit. For example, with reference to FIG. 4, the quick-start module 420 includes a saturation limiting circuit 424 provided to limit current through the inductive element 434 of the boost converter 430 to establish the output current level in response to the quick-start enable signal. According to some implementations, the current through the inductive element 434 is limited to a level that is characterized by a saturation condition of the inductive element 434. In some implementations, the saturation limiting circuit 424 is configured to set a limit of the current flowing through the inductive element 434 to a predetermined output level (e.g., 2.5 A). For example, in some implementations, this prevents saturation of the inductive element 434.

According to some implementations, as represented by block 8-4c, the process 800 includes enabling the ripple control module. For example, with reference to FIG. 4, the quick-start module 420 includes a ripple control module 426 provided to reduce current ripple in the output current level by adjustment of a switching frequency in response to the quick-start enable signal. According to some implementations, the ripple control module 426 includes an oscillator 428 that provides switching frequency that is increased in response to the quick-start enable signal. In some implementations, ripple control module 426 is configured to increase the switching frequency of an oscillator 428 above a predetermined switching frequency (e.g., from 2 MHz to 2.5 MHz). For example, in some implementations, this reduces ripple in the current flowing through the inductive element 434.

As represented by block 8-5, the process 800 includes determining whether quick-start disable conditions are satisfied. For example, with reference to FIG. 4, the sensor assembly 410 is configured to turn off the quick-start enable signal in response to determining that the electrical output of the boost converter 430 (e.g., $V_{OUT}$ 406) satisfies a fourth threshold. In some implementations, the fourth threshold is approximately 95% of a set-point output level. According to some implementations, for example, the quick-start disable conditions are satisfied when 0.95*$V_{REF}$ 404<$V_{OUT}$ 406 or $V_{IN}$ 402>$V_{REF}$ 404. For example, with reference to FIG. 6, when $V_{IN}$ 402>$V_{REF}$ 404 or 0.95*$V_{REF}$ 404<$V_{OUT}$ 406, the output of the AND gate 616 is logic low (e.g., 0) and the voltage boost assembly 400 operates under regular parameters.

If the quick-start disable conditions are not satisfied, the process continues to block 8-4. If the quick-start disable conditions are satisfied, the process continues to block 8-2.

Example Integrated Circuits

Figure 9A:
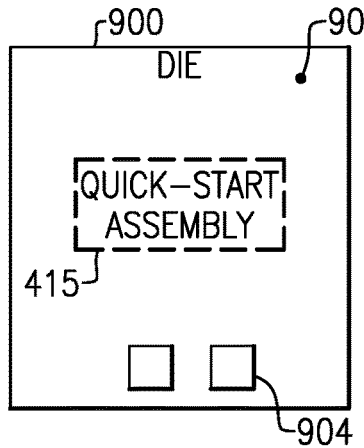
FIG. 9A-9C are block diagrams of different integrated circuit (IC) implementations of the voltage boost assembly in FIG. 4 according to some implementations.
Figure 9B:
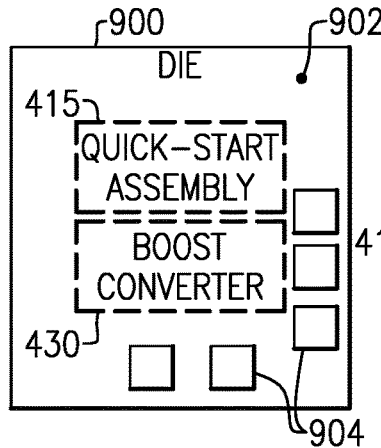
Figure 9C:
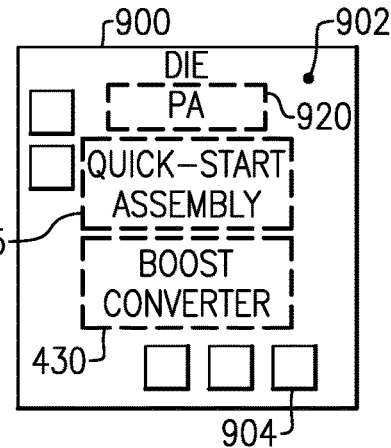

FIGS. 9A-9C are block diagrams of various integrated circuits (ICs) according to some implementations. While some example features are illustrated, those skilled in the art will appreciate from the present disclosure that various other features have not been illustrated for the sake of brevity and so as not to obscure more pertinent aspects of the example implementations disclosed herein. To that end, for example, FIG. 9A shows that in some implementations, some or all portions of the quick-start assembly 415, which operates the voltage boost assembly 400 under quick-start parameters when quick-start conditions are satisfied, can be part of a semiconductor die 900. By way of an example, the quick-start assembly 415 can be formed on a substrate 902 of the die 900. A plurality of connection pads 904 can also be formed on the substrate 902 to facilitate functionalities associated with some or all portions of the quick-start assembly 415.

FIG. 9B shows that in some implementations, a semiconductor die 900 having a substrate 902 can include some or all portions of the quick-start assembly 415 and some or all portions of the boost converter 430, which operates according to conventional boost converter techniques. A plurality of connection pads 904 can also be formed on the substrate 902 to facilitate functionalities associated with some or all portions of the quick-start assembly 415 and some or all portions of the boost converter 430.

FIG. 9C shows that in some implementations, a semiconductor die 900 having a substrate 902 can include some or all portions of the quick-start assembly 415 and some or all portions of the boost converter 430, and some or all portions of the power amplifier (PA) 920. A plurality of connection pads 904 can also be formed on the substrate 902 to facilitate functionalities associated with some or all portions of the quick-start assembly 415 and some or all portions of the boost converter 430, and some or all portions of the PA 920.

Figure 10:
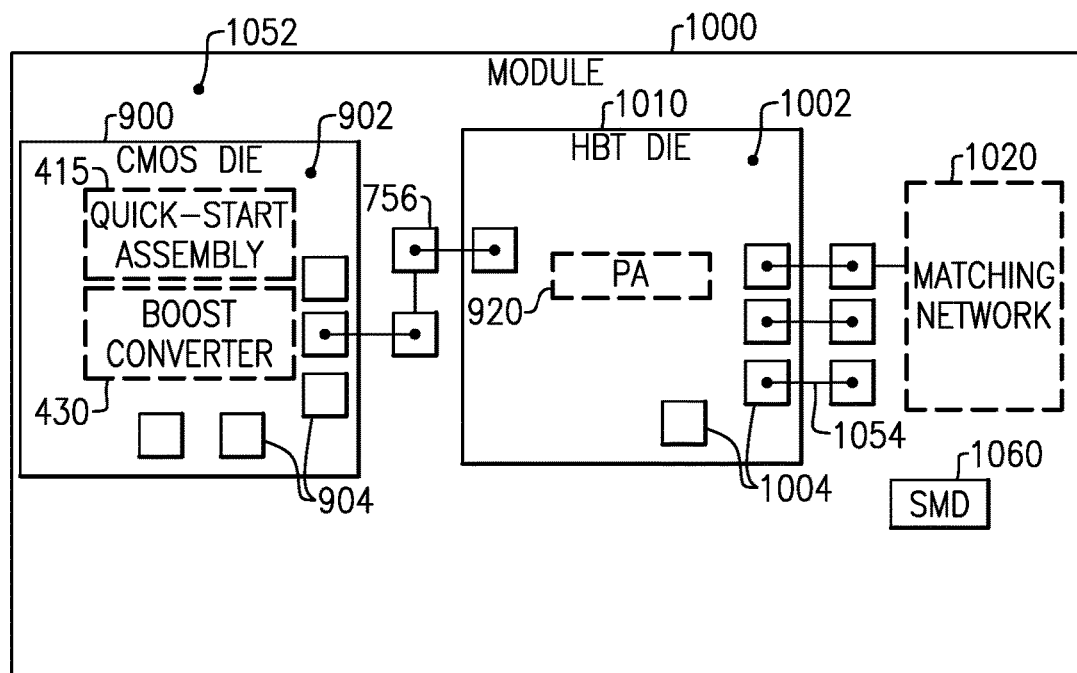
FIG. 10 is a block diagram of an example power amplifier module according to some implementations.

In some implementations, one or more features described herein can be included in a module. FIG. 10 is a schematic diagram of an implementation of a module 1000 including the voltage boost assembly 400 in FIG. 4 according to some implementations. While some example features are illustrated, those skilled in the art will appreciate from the present disclosure that various other features have not been illustrated for the sake of brevity and so as not to obscure more pertinent aspects of the example implementations disclosed herein. The module 1000 includes a packaging substrate 1052, connection pads 1056, a CMOS (complementary metal-oxide semiconductor) die 900, a HBT (heterojunction bipolar transistor) die 1010, a matching network 1020, and one or more surface mount devices 1060. In some implementations, the module 1000 is at least one of a power amplifier module (PAM) or a front-end module (FEM).

The CMOS die 900 includes a substrate 902 including some or all portions of the bias circuit 200 and some or all portions of the bias circuit 910. A plurality of connection pads 904 is formed on the substrate 902 to facilitate functionalities associated with some or all portions of the quick-start assembly 415 and some or all portions of the boost converter 430. Similarly, the HBT die 1010 includes a substrate 1002 including some or all portions of the PA 920.

The HBT die 1010 also includes a plurality of connection pads 1004 formed on the substrate 1002 to facilitate functionalities associated with some or all portions of the PA 920.

The connection pads 1056 on the packaging substrate 1052 facilitate electrical connections to and from each of the CMOS die 900 and the HBT die 1010. For example, the connection pads 1056 facilitate the use of wirebonds 1054 for passing various signals and supply currents and/or voltages to each of the CMOS die 900 and the HBT die 1010.

In some implementations, the components mounted on the packaging substrate 1052 or formed on or in the packaging substrate 1052 can further include, for example, one or more surface mount devices (SMDs) (e.g., 1060) and one or more matching networks (e.g., 1020). In some implementations, the packaging substrate 1052 can include a laminate substrate.

In some implementations, the module 1000 can also include one or more packaging structures to, for example, provide protection and facilitate easier handling of the module 1000. Such a packaging structure can include an overmold formed over the packaging substrate 1052 and dimensioned to substantially encapsulate the various circuits and components thereon.

It will be understood that although the module 1000 is described in the context of wirebond-based electrical connections, one or more features of the present disclosure can also be implemented in other packaging configurations, including flip-chip configurations.

Example RF Device

Figure 11:
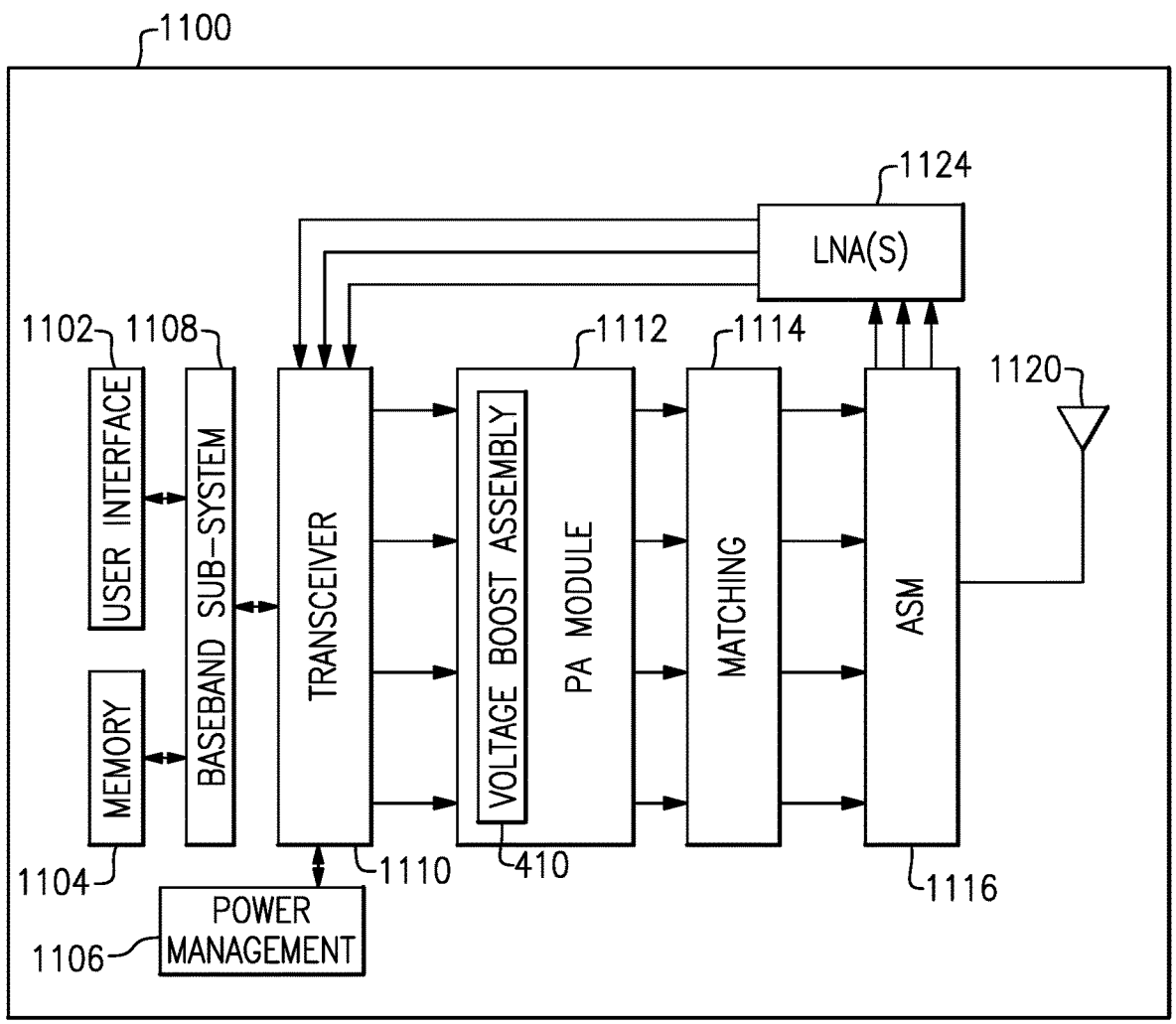
FIG. 11 is a block diagram of an example radio frequency (RF) device according to some implementations.

FIG. 11 schematically depicts an example radio-frequency (RF) device 1100 having one or more advantageous features described herein. While pertinent features are shown, those of ordinary skill in the art will appreciate from the present disclosure that various other features have not been illustrated for the sake of brevity and so as not to obscure more pertinent aspects of the example implementations disclosed herein. To that end, in some implementations, the RF device 1100 is a wireless device. In some implementations, such a wireless device can include, for example, a cellular phone, a smart-phone, a hand-held wireless device with or without phone functionality, a computer, a laptop, a tablet computer, a peripheral device, a router, a repeater, a wireless access point, a base station, or the like.

In some implementations the RF device 1100 includes one or more power amplifiers (PAs) (e.g., the PA 920 in FIGS. 9C and 10) in a PA module (PAM) 1112 configured to receive their respective RF signals from a transceiver 1110 that can be configured and operated in known manners to generate RF signals to be amplified and transmitted, and to process received signals. In some implementations, the PAM 1112 can include one or more filters and/or one or more band/mode selection switches configured to provide duplexing and/or switching functionalities as described herein. According to some implementations, the PAM 1112 includes the voltage boost assembly 400 described above with reference to FIGS. 4-6. For example, the voltage boost assembly 400 operates under quick-start parameters (e.g., the quick-start module 420 is enabled) when the quick-start enable conditions are satisfied, and the voltage boost assembly 400 operates under regular parameters (e.g., according to conventional boost converter techniques) when the quick-start enable conditions are not satisfied.

The transceiver 1110 is shown to interact with a baseband sub-system 1108 that is configured to provide conversion between data and/or voice signals suitable for a user and RF signals suitable for the transceiver 1110. The transceiver 1110 is also shown to be connected to a power management component 1106 that is configured to manage power for the operation of the RF device 1100. In some implementations, the power management component 1106 can also control operations of the baseband sub-system 1108 and other components of the RF device 1100.

The baseband sub-system 1108 is shown to be connected to a user interface 1102 to facilitate various input and output of voice and/or data provided to and received from the user. The baseband sub-system 1108 can also be connected to a memory 804 that is configured to store data and/or instructions to facilitate the operation of the wireless device, and/or to provide storage of information for the user.

In some implementations, a matching network 1114 is provided between the PAM 1112 and the antenna switch module (ASM) 1116. In some implementations, the ASM 1116 is connected to an antenna 1120 and is configured to control which signals are transmitted via the antenna 1120.

As shown in FIG. 11, some received signals via the antenna 1120 are shown to be routed from the ASM 1116 to one or more low-noise amplifiers (LNAs) 1124. Amplified signals from the one or more LNAs 1124 are shown to be routed to the transceiver 1110.

A number of other wireless device configurations can utilize one or more features described herein. For example, the RF device 1100 does not need to be a multi-band device. In another example, the RF device 1100 can include additional antennas such as diversity antenna, and additional connectivity features such as Wi-Fi, Bluetooth, and GPS.

Example Power Management Integrated Circuit

Figure 12:
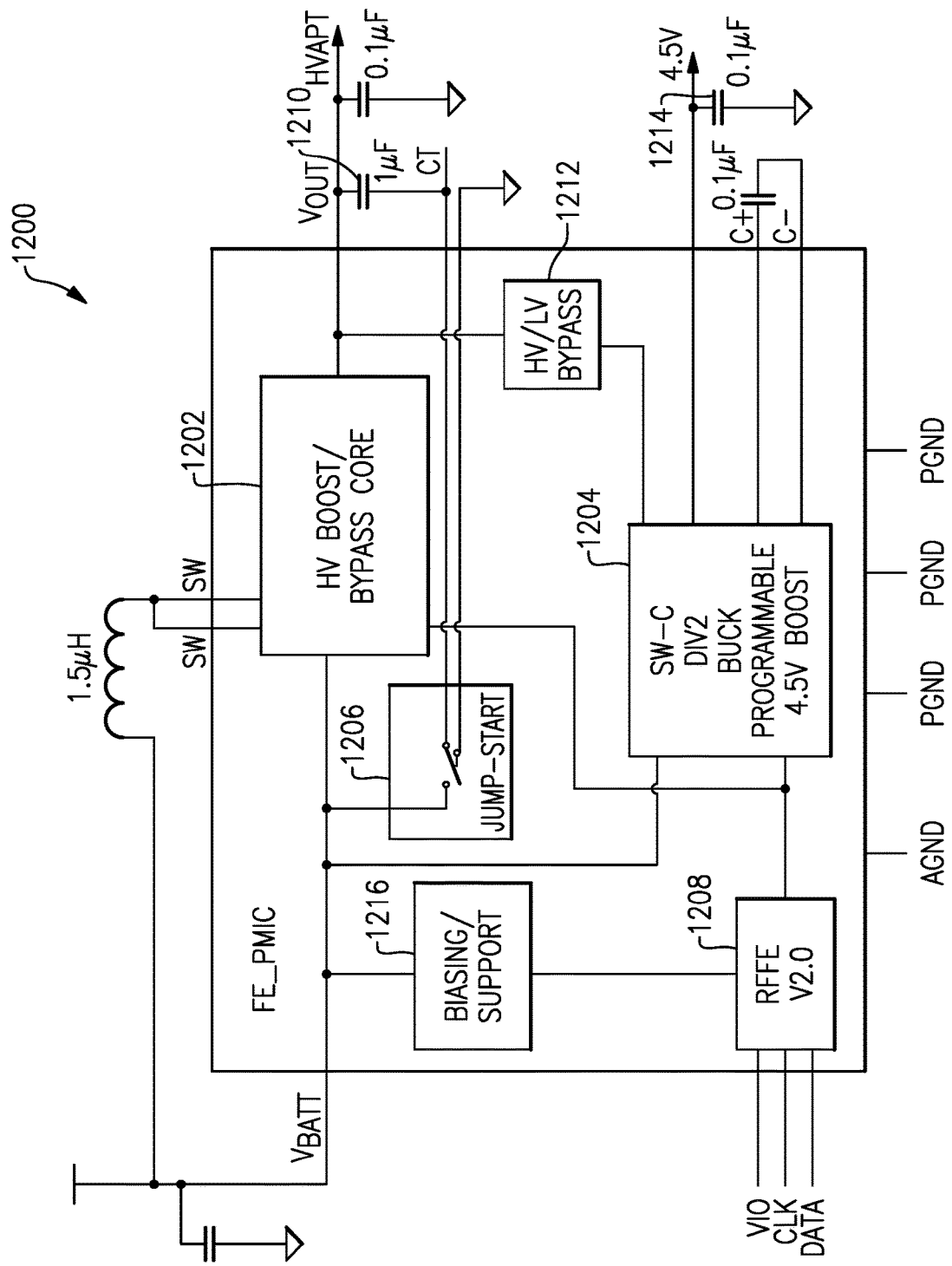
FIG. 12 is a block diagram of an example of a power management integrated circuit in accordance with certain aspects of the present disclosure.

FIG. 12 is a block diagram of an example of a power management integrated circuit ("PMIC") 1200 in accordance with certain aspects of the present disclosure. The PMIC 1200 may include a number of circuit elements for modifying a supply voltage. The modified supply voltage may then be provided to one or more circuit elements powered by the PMIC 1200. The supply voltage may be a battery voltage or a voltage received from a mains line, such as when a device is plugged into a wall socket. Modifying the supply voltage may include increasing or decreasing the supply voltage. In some cases, the PMIC 1200 may include overvoltage protection to prevent an unexpected voltage increase caused by a power surge event. Some examples of overvoltage protection that may be incorporated into the PMIC 1200 are described in U.S. application Ser. No. 16/044,410, which was filed on Jul. 27, 2018, is titled "APPARATUS AND METHOD FOR POWER AMPLIFIER SURGE PROTECTION," and which is hereby incorporated by reference in its entirety herein; and in U.S. application Ser. No. 16/044,298, which was filed on Jul. 27, 2018, is titled "APPARATUS AND METHOD FOR SURGE PROTECTION OF A CHARGE-PUMP POWERED POWER AMPLIFIER," and which is hereby incorporated by reference in its entirety herein.

In some cases, the PMIC 1200 may be a separate component, for example, a separate integrated circuit, that is included within a wireless device. For instance, the PMIC 1200 may be the power management component 1106. Alternatively, the PMIC 1200 may be incorporated into another element of the wireless device. For example, the PMIC 1200 may be incorporated into a power amplifier module 1112.

The PMIC 1200 may include a number of circuit elements that facilitate the modification of the supply voltage, which may then be output to a subsequent circuit element, such as a power amplifier. For example, the PMIC 1200 may include a boost converter 1202, a boost converter 1204, a jump-start circuit 1206, and a serial interface 1208. The boost converter 1202 may be configured to output a relatively high voltage output to a subsequent circuit, such as a power amplifier controller. Further, the boost converter 1204 may be configured to output a relatively low voltage output to a subsequent circuit, such as a power amplifier. For example, the boost converter 1204 may output a voltage of 4.5 volts or less. In contrast, the boost converter 1202 may output a voltage of 8-13 volts, or more. In some cases, the boost converter 1202 may output a lower voltage. For example, the boost converter 1202 may output a voltage of 3-7 volts. Further, as the charge on the output capacitor 1210 is ramping up, the voltage output by the boost converter 1202 may include lower voltages, such as between 0-3 volts. In some cases, the boost converter 1204 may be a charge-pump or may include a programmable boost converter. Further, the output of the boost converter 1204 may be supplied to the output capacitor 1210 and/or to a 4.5 volt output port, which may be connected to an output capacitor 1214. Although the PMIC 1200 may be used to provide a voltage to different types of circuits, to simplify discussion, the present disclosure primarily describes the circuit powered by the PMIC 1200 as a power amplifier.

The jump-start circuit 1206 may include a circuit that reduces the amount of time for the output of the PMIC 1200 to reach a target voltage. For example, the jump-start circuit 1206 can reduce the amount of time for the output to ramp from 3 volts to 11 volts from 20 microseconds to 10 microseconds. The jump-start circuit 1206 may reduce the tamp time by modifying the connection of the output capacitor 1210 such that a bottom plate of the capacitor is connected to a supply voltage instead of ground during start-up or when an output voltage is below a threshold voltage and a desired output voltage is above a threshold voltage. The threshold voltage of the output voltage and the desired output voltage may differ. For example, the jump-start circuit 1206 may modify a connection of the output capacitor 1210 when an output voltage is below a first threshold (e.g., 3 or 4 volts) and the desired output voltage is above a second threshold (e.g., 8 or 9 volts).

The serial interface 1208 may be an interface that enables control of the jump-start circuit 1206. For example, the one or more threshold used by the jump-start circuit 1206 to determine when to switch the connection of the output capacitor 1210 may be programmed via the serial interface 1208. In some cases, the serial interface 1208 may include an interface that implements the MIPI® (also referred to as "Mobile Industry Processor Interface") specification or standard promulgated by the MIPI® Alliance. For example, the serial interface 1208 may implement the MIPI RF Front-End Control Interface (MIPI RFFE) or the MIPI RFFE v2.0 specification.

In addition to the above-described elements, the PMIC 1200 may include a number of additional elements for managing control of a supply voltage to elements of a wireless device. For example, the PMIC may include a bypass circuit 1212 that enables the output of the boost converter 1204 to be applied to the output capacitor 1210. Applying the 4.5 volt output of the boost converter 1204 to a power amplifier connected to the output capacitor 1210 may be desired when the wireless device is configured to operate in 2G mode as opposed to 3G, 4G, 4G LTE, 5G, or other communication modes. Further, the PMIC 1200 may include additional biasing or support circuitry 1216 that may support operation of the PMIC 1200.

Figure 13:
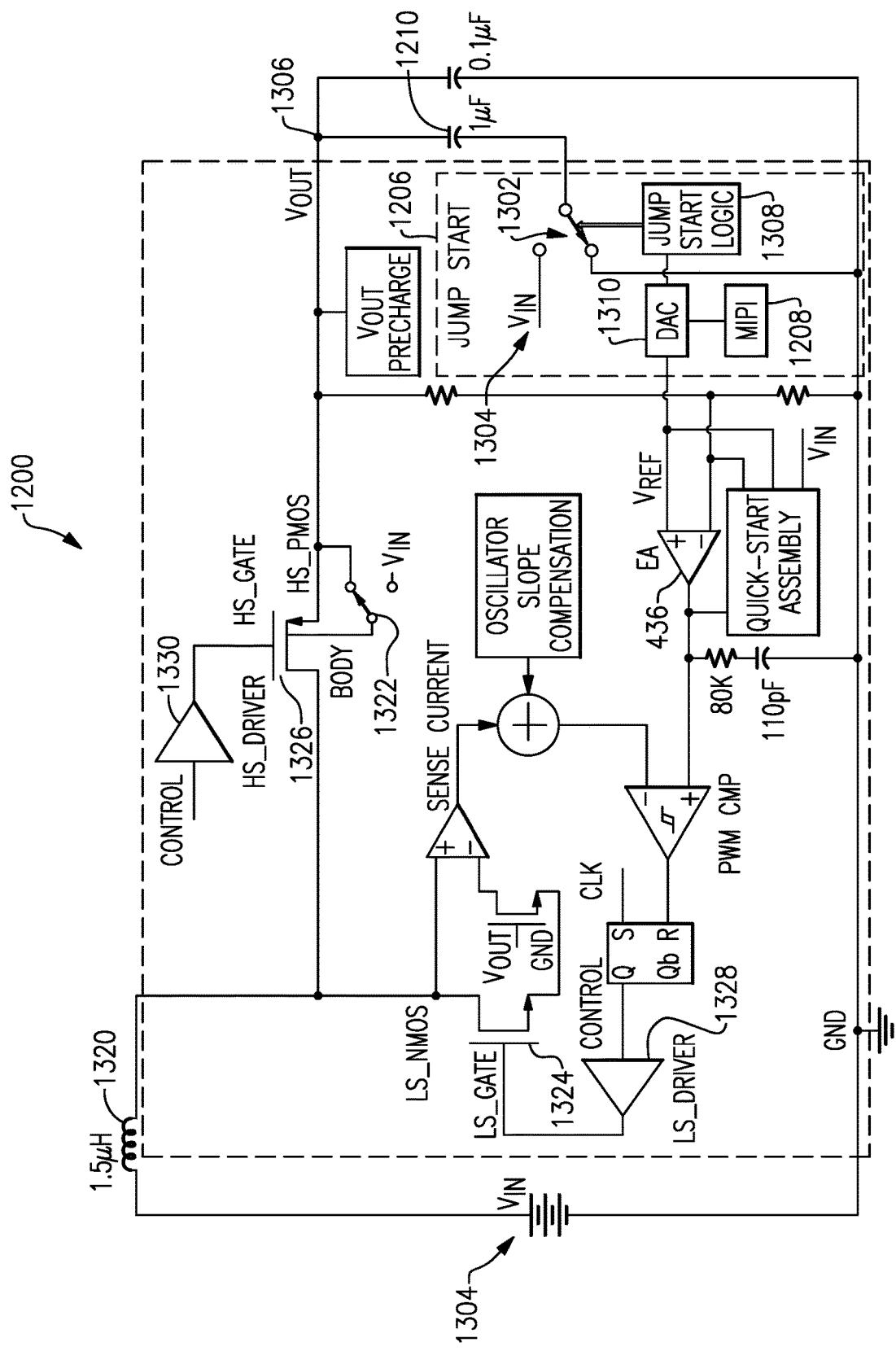
FIG. 13 illustrates a circuit diagram of an example of a power management integrated circuit in accordance with certain aspects of the present disclosure.

FIG. 13 illustrates a circuit diagram of an example of a power management integrated circuit 1200 in accordance with certain aspects of the present disclosure. As previously described, the PMIC 1200 may include a jump-start circuit 1206. The jump-start circuit 1206 may include a switch 1302. The switch may be a relatively large switch. For example, the switch may be a 100 mΩ switch or larger.

This switch 1302 may modify the connection of a plate (e.g., the bottom plate) of the output capacitor 1210. The switch 1302 may modify connection of the output capacitor 1210 based on the boost output voltage of the PMIC 1200 and/or one of more threshold or setpoint voltages. By modifying the connection of the output capacitor 1210, it is possible to modify the ramp time, or the amount of time it takes for the output voltage to reach a desired voltage.

The setpoint or boost setpoint voltage may refer to a desired output voltage of the PMIC 1200. The desired output voltage of the PMIC 1200 may be based on the device receiving the voltage (e.g., a power amplifier or a power amplifier controller) and/or a control signal. The control signal may be received from a base station or may be based on a signal received from the base station. Alternatively, or in addition, the control signal may be based on a control signal from a baseband processor, transceiver, processor, or other component of the wireless device.

The switch 1302 may be configured to switch a connection of a plate of the output capacitor 1210 from a ground connection to an input or supply voltage 1304 (e.g., a battery voltage). A first plate of the output capacitor 1210 may be connected to an output voltage node, or Vout 1306. A second plate of the output capacitor 1210 may be connected to one of the ground connection or the supply voltage 1304 based on the configuration of the switch 1302. For ease of description, and without limiting the orientation of the output capacitor 1210, the first plate may be referred to as a "top plate" and the second play may be referred to as a "bottom plate."

The Vout 1306 may be connected to any subsequent circuit that may be powered, or which may receive a voltage from a PMIC. For example, the Vout 1306 may be connected to a power amplifier or a power amplifier controller.

Jump start logic 1308 may be used to control the switch 1302 based on the output voltage and the one or more threshold. In some embodiments, when the output setpoint is greater than 8V, 3 times the input voltage, and/or 2 times the current output voltage, the jump start logic 1308 can control the bottom plate of the output capacitor to be connected to the input supply. When the next output setpoint is 3V lower than the actual output voltage, the bottom plate of the output capacitor may be connected to ground. The jump start logic 1308 may be implemented using a set of NAND gates, or other logic gates. The jump start logic 1308 may determine the requested output voltage and compare it to the input voltage. The jump start logic 1308 may determine based on the comparison as to whether the PMIC 1200 should use the jump start feature. If the difference between Vin 1304 and Vout 1306 is high, then the jump start feature may be enabled. The jump start logic 1308 may be configured to control the switch 1302 to connect the bottom plate of the output capacitor 1210 to the input voltage 1304 when the output voltage is determined to be below a threshold voltage. Further, the jump start logic 1308 may control the switch 1302 to connect the bottom plate to ground when the output voltage is determined to be above the threshold voltage. In some cases, the jump start logic 1308 may further be configured to control the switch 1302 based on a difference between a boost setpoint and the output voltage. For example, if the output voltage is less than a threshold voltage, and the boost setpoint voltage is above a second threshold voltage, the jump start logic 1308 may cause the switch 1302 to connect the bottom plate of the output capacitor 1210 to the input voltage 1304. Otherwise, the bottom plate of the output capacitor 1210 may be connected to ground. Thus, in some cases, even if the output voltage is below a particular threshold, the bottom plate of the output capacitor 1210 may remain connected to ground. The jump start logic 1308 may be controlled or configured based on one or more control signals received at the serial interface 1208, or based on one or more threshold levels set based on signals received at the serial interface 1208.

In some cases, a first threshold voltage may indicate when to connect a plate of the capacitor 1210 to ground, and a second threshold voltage may indicate when to connect the plate of the capacitor 1210 to Vin 1302. The first and second threshold may in some cases be the same. In other cases, the first threshold voltage and the second threshold voltage may differ. By having different threshold voltages for determining when to connect the capacitive element to a supply voltage and when to connect the capacitive element to ground, switch bouncing is reduced or eliminated. In some cases, the first threshold and the second threshold may depend on one or more of the boost output setpoint, the actual output voltage, and/or the actual input voltage. The actual output voltage and the actual input voltage may vary from the ideal or selected voltages due to differences in process, temperature, or other real world constraints.

Further, in some cases, the determination of whether to connect the bottom plate of the output capacitor 1210 to ground or Vin 1304 may be based on a difference between the boost setpoint and the output voltage. For example, the bottom plate of the output capacitor 1210 may be connected to Vin 1304 when it is determined that the boost setpoint (or desired output voltage of the boost converter) is at least twice the current output voltage. However, the bottom plate of the output capacitor 1210 may remain connected to ground if it is determined that the boost setpoint is less than twice the current output voltage. As another example, the jump start logic 1308 may connect the bottom plate of the output capacitor 1210 to Vin 1304 when the difference between the output voltage and the boost setpoint is greater than 2 volts, 3 volts, or some other threshold difference. When the difference between the output voltage and the boost setpoint is less than 2 volts, 3 volts, or some other threshold difference, the bottom plate of the output capacitor 1210 may remain connected to ground. Advantageously, in certain aspects, by connecting the bottom plate of the output capacitor 1210 to Vin 1304 only when a difference between the output voltage of the boost converter 1202 or of the PMIC 1200 is greater than a threshold, the switching cost may be reduced or avoided. The switching cost may include the time and power used to control the switch 1302.

The connection of the bottom plate of the output capacitor 1210 may be modified multiple times as the output voltage changes in relation to the boost setpoint, or other switching threshold voltages. For example, at a first time, the switch 1302 may attach the lower or bottom plate of the output capacitor 1210 to Vin 1304 when the output voltage is, for example, less than half the boost setpoint voltage. At a second time subsequent to the first time, the switch 1302 may attach the bottom plate of the output capacitor 1210 to ground when the output voltage is, for example, 3 volts lower than the boost setpoint voltage. The bottom plate of the output capacitor 1210 may remain connected to ground as the output voltage continues to rise, or settles around or above the boost setpoint. At a third time subsequent to the second time, the switch 1302 may attach the bottom plate of the output capacitor 1210 back to Vin 1304 when the output voltage is, for example, less than half the boost setpoint voltage. In some cases, the switch 1302 may not adjust the bottom plate of the output capacitor 1210 at the third time because, for example, a power-off command may cause switching to cease. Alternatively, the bottom plate connection may be adjusted at the third time to help dissipate a charged capacitor (e.g., the output capacitor 1210). In some cases, the jump-start circuit may connect the bottom plate of the output capacitor to the supply voltage (Vin 1304) when the boost setpoint is at or above 8 volts, or at least three times the supply voltage.

The one or more thresholds and/or the boost setpoint may be received at a serial interface 1208. As previously described the serial interface 1208 may be a MIPI RFFE interface. However, the present disclosure is not limited as such, and the serial interface 1208 may include any type of serial interface for communicating the one or more thresholds, the boost setpoint, or any other control data to the PMIC 1200 or the jump-start circuit 1206. Further, in some implementations, the serial interface 1208 may be replaced with a non-serial interface, such as one or more general-purpose input/output (GPIO) pins, a parallel interface, or any other type of interface for providing control data to the PMIC 1200 or the jump-start circuit 1206.

The jump-start circuit 1206 may further include a digital-to-analog converter (DAC) 1310. The DAC 1310 may be used to convert input received at the serial interface 1208 from a digital signal to an analog signal. The output of the DAC 1310 may be provided to the EA 436 as a reference voltage. Further, in some cases, the output of the DAC 310 may be provided to the jump start logic 1308 to control the jump start circuit 1206.

In some embodiments, the jump-start circuit 1206 may be combined with the quick start assembly 415. By combining features of the jump-start circuit 1206 with features of the quick start assembly 415, it is possible to reduce the ramp time of the boost output voltage (e.g., the output voltage at Vout 1306) to half, or less, of what PMICs without the jump-start circuit 1206 and the quick start assembly 415 can achieve. In some embodiments, the quick start assembly 415 can be implemented using one or more features of the quick start assembly described in U.S. Pat. No. 9,584,012, which was filed on Feb. 12, 2016, is titled "QUICK-START HIGH-VOLTAGE BOOST," and which is hereby incorporated by reference in its entirety herein.

During operation, current may be received from the battery or power supply, represented by Vin 1304. The current may flow through the inductor 1320 to either the low side switch 1324 (LS_GATE) or the high side switch 1326 (HS_GATE). The low side switch 1324 may be controlled by the low side driver 1328 (LS_DRIVER) and the high side switch 1326 may be controlled by the high side driver 1330 (HS_DRIVER). Each of the low side and high side gates may be implemented as FETs.

During the charging cycle, the current may flow from Vin 1304 through the inductor 1320 to the low side switch. When charging is finished, the current may flow through the inductor 1320 to the high side switch.

Further, the PMIC 1200 may include a body switch 1322 that controls the Body connection of the high side switch 1326. The body switch 1322 connects to Vin 1304 before the boost functionality of the PMIC 1200 starts. The body switch 1322 connects the high side switch 1326 to Vin because Vin is the highest voltage before the boost starts. Once the boost starts and Vout 1306 exceeds or ramps to be higher than Vin 1304, the body switch 1322 switches to connect the high side switch 1326 to Vout 1306 instead of Vin 1304.

The charge will collect on the capacitor 1210 to create the boost for the PMIC 1200. The output can be programmed from any value between 1.8 volts, which may be provided by a charge pump (not shown) up to 11 volts supported by the boost functionality of the PMIC 1200. The desired output voltage can be programmed into the control system of the PMIC 1200. The PMIC 1200, using for example the serial interface 1208 may receive an indication of a desired output voltage. Based on the desired output voltage, the PMIC 1200 may determine whether to enter a bypass mode or a boost mode. According to the output voltage setpoint, the PMIC 1200 can operate in a boost mode when the output voltage is higher than the input voltage, or a bypass mode with the high-side PMOS on when the output voltage is lower than the input voltage.

Simulation Results

Figure 14:
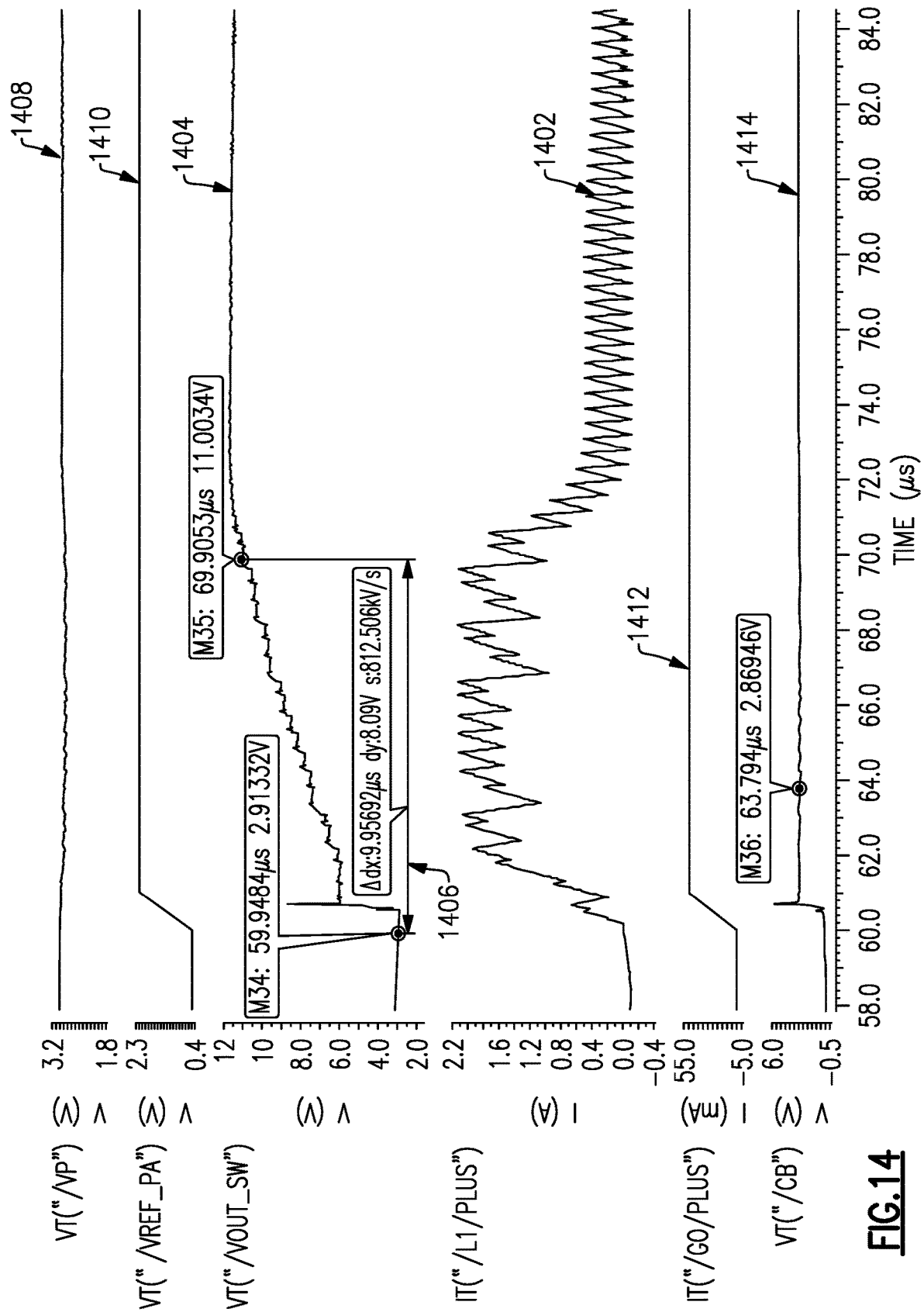
FIG. 14 is a graph of a simulation illustrating timing of a boost output voltage for a power management integrated circuit implementing a jump-start circuit in accordance with certain aspects of the present disclosure.

FIG. 14 presents a series of graphs of a simulation illustrating timing of a boost output voltage for a power management integrated circuit implementing a jump-start circuit in accordance with certain aspects of the present disclosure. In the simulation, the boost current limit is 2.1 amps as illustrated by the graph 1402. The first graph 1408 represents the battery voltage Vin. Further, in the simulation, the output capacitor was set to 0.7 µF. Further, the input voltage Vin was set to 3 volts, and the desired output voltage was set to 11 volts. A power amplifier with a 50 mA load was attached to the PMIC during the simulation.

The graph 1410 represents a control value for specifying the desired output voltage. A low value (e.g., 0.4 volts in this example) corresponds to no boost (e.g., Vout is equal to Vin or the battery voltage). A voltage of 2.3 indicates a maximum output voltage where the boost voltage is set to maximum. Thus, the voltage of 2.3 indicates that the output of the PMIC should be around 11 volts. The output voltage can have any value in between. To obtain a value in between, the control voltage represented by the graph 1410 can be set between the 0.4 and 2.3 values. The control value can be obtained from a voltage divider that can use a variable resistor or a potentiometer to modify the control voltage.

As illustrated by the graph 1404, the output voltage begins at 3 volts. With the 50 mA load at the boost output of the PMIC during ramp up, it takes about 8.2 µs to ramp from 3 volts to 10 volts as can be seen from the graph 1404. A further review of the graph 1404 indicates that the ramp time to ramp from 3 volts to 11 volts is about 10 µs as illustrated by the annotated line 1406. As PMICs without the jump-start system of the present disclosure usually take in excess of 20 µs to ramp from 3 volts to 11 volts, the simulations indicate that the jump-start system of the present disclosure can reduce ramp time by at least half. In other words, the time to go from Vin to the setpoint is much shorter than without the jump start function. So the time can be cut from 20 µs to 7-8 µs.

The graph 1402 illustrates the inductor current of the current flowing through the inductor 1320 connected to Vin 1304, which in the illustrated embodiment of FIG. 13 is a 1.5 pH inductor. As can be determined from the graph of the inductor current, the current flowing through the inductor 1320 can ramp up to the current limit (e.g., about 2.2 A) relatively quickly (e.g., in about 2 µs) using the jump start functionality disclosed herein. By being able to go to the current limit quickly, the PMIC 1200 can ramp up quicker than PMICs without the jump start feature.

The graph 1412 represents the current load on the output of the PMIC 1200. The graph 1414 represents the voltage on the lower plate of the output capacitor 1210. Comparing the graph 1414 to the graphs 1404/1410, it can be seen that when the PMIC 1200 is set to output the battery voltage without a voltage boost, the lower plate of the output capacitor 1210 may be set to ground, and the voltage on the bottom plate is 0 as illustrated in the graph 1414. However, when the control voltage, represented by the graph 1410, switches to 2.3 volts, indicating that the output voltage should be boosted to a maximum supported value (e.g., approximately 11-12 volts in this non-limiting example), the output voltage represented by the graph 1404 will increase from 2.9 volts to 11 volts and the lower plate of the output capacitor, represented by the graph 1414, will be switched to the input voltage Vin or the battery voltage, which is approximately 2.869 volts in this case. Thus, the graph 1414 goes from ground to 2.869 volts, or close to the battery voltage of 3 volts. As can be seen by comparing the graph 1414 to 1408, the voltage applied to the bottom plate of the capacitor may not precisely match the input voltage. This discrepancy can be due to a voltage drop attributable to battery resistance and wire resistance between the battery and the input of the PMIC. As such, the actual input voltage at the PMIC may drop from around 3 volts to 2.869V when the load current increases from 0 mA to 50 mA.

As illustrated by the graph 1414, there may be a voltage spike when the bottom plate of the capacitor is switched from ground to Vin. The capacitor may be sized to handle the voltage spike. For instance, in the present non-limiting example, the capacitor can handle up to 16 volts, which is well in excess of the 6 volt voltage spike.

Figure 15:
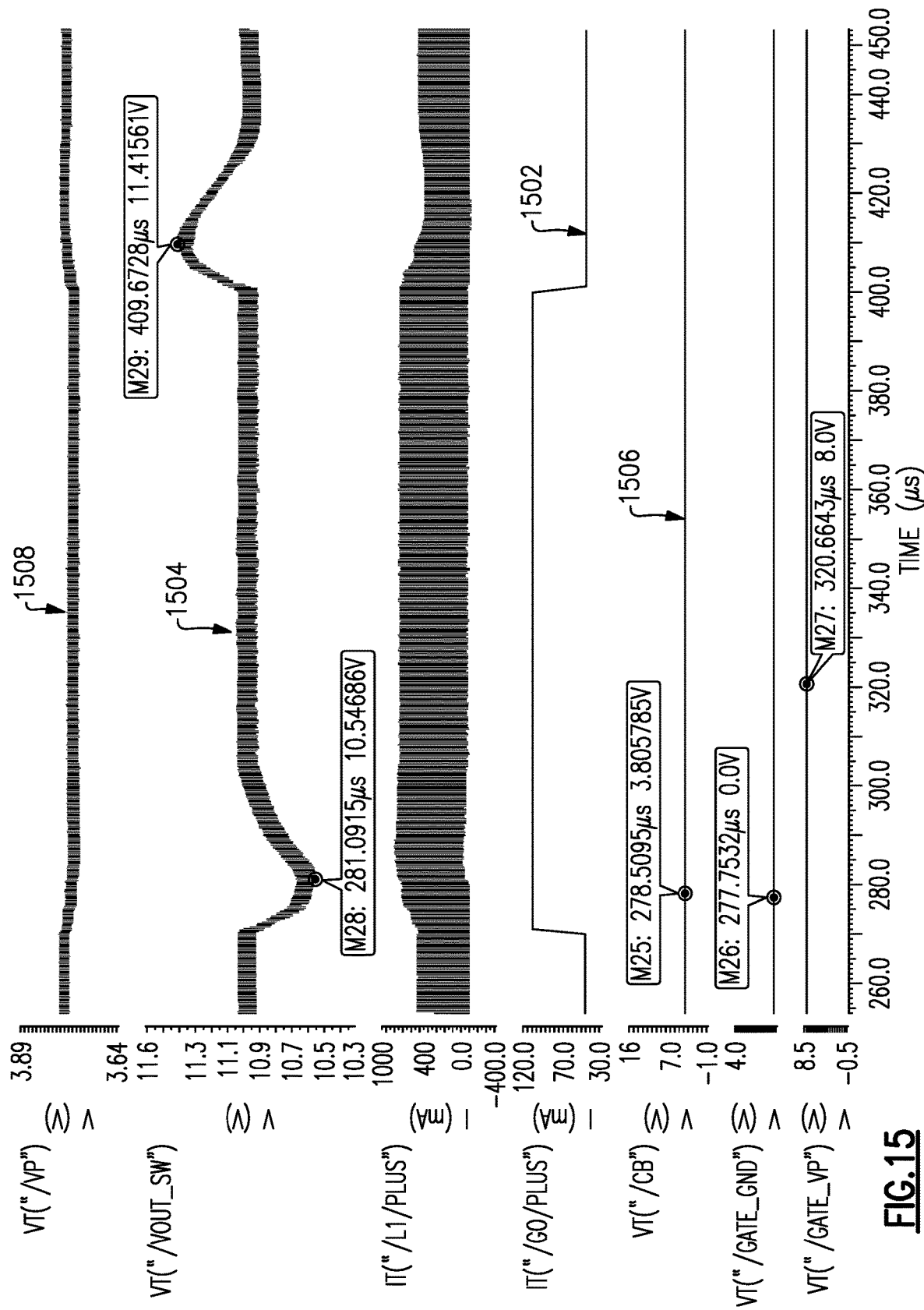
FIG. 15 is a graph of a simulation illustrating a transient response of a boost output voltage for a power management integrated circuit implementing a jump-start circuit in accordance with certain aspects of the present disclosure.

FIG. 15 presents a series of graphs of a simulation illustrating the load transient performance with the boost when implementing the jump-start circuit. The graphs illustrate a transient response of a boost output voltage for a power management integrated circuit implementing a jump-start circuit in accordance with certain aspects of the present disclosure. In the simulation, the boost current limit is 2.1 amps. Further, in the simulation, the output capacitor was set to 0.7 µF. The input voltage Vin was set to 3.8 volts, and the desired output voltage is 11 volts. The graph 1502 illustrates the load transition from light load to heavy load at Vout. The load transitions from approximately 30 or 50 mA for a light load to approximately 110 mA for a heavy load. This load transition may occur as the Vout is applied to the load (e.g., a power amplifier). The load may drive or power a power amplifier. As illustrated by the graph 1502, the load transition occurs in about 1 µs. Moreover, for a load transition between 50 mA and 110 mA in 1 µs, the VCC undershoots 450 mV and overshoots 415 mV with 0.7 µF effective capacitance at Vout.

As illustrated by the graph 1504, when there is a transition from light load to heavy load at the output, the voltage at the Vout switch will dip slightly from 11 volts to 10.54 volts due to the fast load transient. The dip will cause a boost control loop and quick-start logic to make an adjustment and bring the voltage back to the setpoint after roughly 10-15 µs. Similarly, when there is a transition from heavy load to light load at the output, the boost will overshoot, and there will be a roughly 10-15 µs time period as the boost control loop brings the boost back down to setpoint. The boost control loop and the quick-start logic can bring the transient back to the setpoint in the undershoot case. The boost control loop can cause the output voltage to settle down to the setpoint in the overshoot case. In some cases, the jump-start logic may not be involved when the boost setpoint is not changed.

Further, as illustrated by the graph 1506, the voltage on the bottom plate of the capacitor 1210 remains steady. In other words, the voltage on the bottom plate remains at the input voltage, which in this non-limiting example is set to 3.8 volts as indicated by the graph 1508. The simulations illustrated in FIG. 15 illustrates a steady connection of the bottom plate to the input voltage under load transient.

Additional Embodiments

Figure 16:
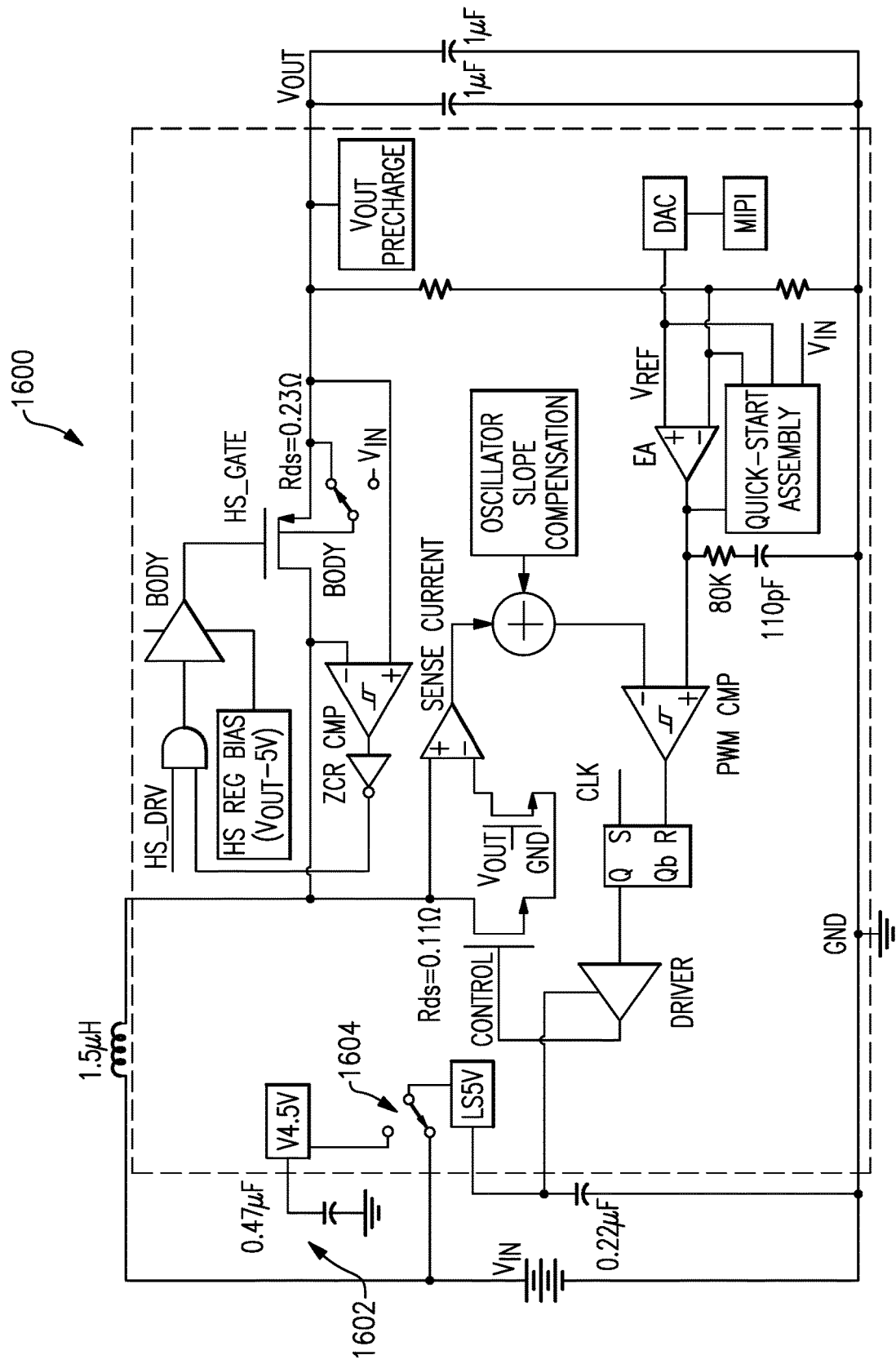
FIG. 16 illustrates a circuit diagram of a second example of a power management integrated circuit in accordance with certain aspects of the present disclosure.

FIG. 16 illustrates a circuit diagram of a second example of a power management integrated circuit 1600 in accordance with certain aspects of the present disclosure. The PMIC 1600 may have a 4.5 volt output 1602 that is configured to provide power for circuit elements that operate at a lower voltage level, such as certain power amplifier controllers or power amplifiers configured to support 2G communication modes.

Further, the PMIC 1600 may have a low-side driver. A switch 1604 may be connected to the low side driver and may switch between the input voltage Vin and the 4.5 volt output pin to provide supply to the low-side driver. The PMIC 1600 may include or may be an alternative embodiment of the voltage boost assembly 400.

As stated above, the PMICs of the present disclosure (e.g., the PMIC 1200) improve or halve the amount of time to ramp up from 3 volts to 11 volts. Further, the inrush current may be lowered to 2.1 amps. The efficiency of the PMIC with the jump-start circuit may be between 89% and 90%.

Terminology

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A voltage boost assembly comprising:
a boost converter having a capacitive element arranged at an output, a first plate of the capacitive element connectable to a power amplifier;
a jump-start circuit configured to connect a second plate of the capacitive element to a ground when a boost setpoint of the boost converter is a first threshold voltage below an output voltage of the boost converter and configured to connect the second plate of the capacitive element to a supply voltage when the boost setpoint of the boost converter satisfies a second threshold voltage; and
a first switch configured to connect a 4.5 volt bias supply output between the ground and the supply voltage.

2. The voltage boost assembly of claim 1 wherein the first threshold voltage and the second threshold voltage are the same voltage.

3. The voltage boost assembly of claim 1 further comprising a sensing circuit configured to determine the output voltage of the boost converter.

4. The voltage boost assembly of claim 1 wherein the first threshold voltage is set at 3 volts.

5. The voltage boost assembly of claim 1 wherein the jump-start circuit connects the second plate of the capacitive element to the supply voltage when the boost setpoint is at or above 8 volts, or at least three times the supply voltage.

6. The voltage boost assembly of claim 1 wherein the jump-start circuit includes a second switch configured to connect the second plate to one of the ground or the supply voltage.

7. The voltage boost assembly of claim 6 wherein the second switch is a field-effect transistor.

8. The voltage boost assembly of claim 6 wherein the second switch creates a 100 milliohm equivalent series resistance.

9. The voltage boost assembly of claim 6 wherein the jump-start circuit includes jump-start logic configured to control the second switch based at least in part on the boost setpoint of the boost converter.

10. The voltage boost assembly of claim 1 wherein the first switch has an impedance of 100 milliohms.

11. The voltage boost assembly of claim 1 wherein the jump-start circuit further includes an interface circuit configured to receive a specification of the boost setpoint.

12. The voltage boost assembly of claim 11 wherein the interface circuit implements a MIPI Specification.

13. A power amplifier module comprising:
a power amplifier; and
a voltage boost assembly configured to supply a voltage to the power amplifier, the voltage boost assembly including a boost converter, a jump-start circuit, and a first switch, the boost converter having a capacitive element arranged at an output of the voltage boost assembly, a first plate of the capacitive element connected to the power amplifier, the jump-start circuit configured to connect a second plate of the capacitive element to a ground when a boost setpoint of the boost converter is a first threshold voltage below an output voltage of the boost converter and configured to connect the second plate of the capacitive element to a supply voltage when the boost setpoint of the boost converter satisfies a second threshold voltage, and the first switch configured to connect a 4.5 volt bias supply output between the ground and the supply voltage.

14. The power amplifier module of claim 13 wherein the voltage boost assembly further includes a sensing circuit configured to determine the output voltage of the boost converter.

15. The power amplifier module of claim 13 wherein the jump-start circuit includes a second switch configured to connect the second plate to one of the ground or the supply voltage based at least in part on the output voltage of the boost converter.

16. The power amplifier module of claim 15 wherein the second switch forms a substantially 100 milliohm equivalent series resistance.

17. The power amplifier module of claim 15 wherein the jump-start circuit includes jump-start logic configured to control the second switch based at least in part on the boost setpoint of the boost converter.

18. The power amplifier module of claim 13 wherein the 4.5 volt bias supply output is a 2G bias supply output.

19. A wireless device comprising:
- a transceiver configured to transmit one or more radio frequency signals via an antenna; and
- a power amplifier module configured to amplify the one or more radio frequency signals prior to transmission by the transceiver, the power amplifier module including a power amplifier and a voltage boost assembly configured to supply a voltage to the power amplifier, the voltage boost assembly including a boost converter, a jump-start circuit, and a first switch, the boost converter having a capacitive element arranged at an output of the voltage boost assembly, a first plate of the capacitive element connected to the power amplifier, the jump-start circuit configured to connect a second plate of the capacitive element to a ground when a boost setpoint of the boost converter is a first threshold voltage below an output voltage of the voltage boost assembly and configured to connect the second plate of the capacitive element to a supply voltage when the boost setpoint of the boost converter satisfies a second threshold voltage, and the first switch configured to connect a 4.5 volt bias supply output between the ground and the supply voltage.

20. The wireless device of claim 19 wherein the jump-start circuit includes a second switch configured to connect the second plate to one of the ground or the supply voltage.

\* \* \* \* \*